United States Patent
Yamanaka et al.

(10) Patent No.: US 6,735,714 B2
(45) Date of Patent: May 11, 2004

(54) PROCESSING UNIT AND PROCESSING METHOD

(75) Inventors: Ryutaro Yamanaka, Yokohama (JP); Hidetoshi Suzuki, Yokohama (JP); Hideyuki Kabuo, Kyoto (JP); Minoru Okamoto, Suita (JP); Kevin Stone, Lafayette, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/252,394

(22) Filed: Sep. 24, 2002

(65) Prior Publication Data

US 2003/0066022 A1 Apr. 3, 2003

Related U.S. Application Data

(60) Continuation of application No. 09/974,807, filed on Oct. 12, 2001, now Pat. No. 6,477,661, which is a division of application No. 09/147,663, filed as application No. PCT/JP98/02909 on Jun. 29, 1998, now Pat. No. 6,330,684.

(30) Foreign Application Priority Data

Jun. 30, 1997 (JP) .............................. 9-173878
Jun. 16, 1998 (JP) ........................... 10-168567

(51) Int. Cl.[7] ........................ G06F 11/00; G01R 31/28
(52) U.S. Cl. ........................................ 714/1; 714/795
(58) Field of Search ................ 714/1, 25, 26, 714/30, 31, 43, 795, 796, 792, 764, 819

(56) References Cited

U.S. PATENT DOCUMENTS 4,606,027 A 8/1986 Otani
4,614,933 A 9/1986 Yamashita et al.

(List continued on next page.)

FOREIGN PATENT DOCUMENTS

| JP | 63215227 | 9/1988 |
|----|----------|--------|
| JP | 6-164423 | 6/1994 |
| JP | 8-84082 | 3/1996 |
| JP | 09148943 | 6/1997 |
| JP | 9-148943 | 6/1997 |
| JP | 10107651 | 4/1998 |
| JP | 10209882 | 8/1998 |
| JP | 11-55130 | 2/1999 |

OTHER PUBLICATIONS

Ueda et al., "A 16–bit Digital Signal Processor with Specially Arranged Multiply–Accumulator for Low Power Consumption", IEICE Trans. Electron., vol. E–78–C, No. 12, Dec. 1995.

H. Lou, "Viterbi Decoder Design for the IS–95 CDMA Forward Link", IEEE 46th Vehicular Technology Conference, No. 2, 1996, pp. 1346–1350.

(List continued on next page.)

Primary Examiner—Nadeem Iqbal
(74) Attorney, Agent, or Firm—Greenblum & Bernstein, P.L.C.

(57) ABSTRACT

A digital signal processor capable of performing a Viterbi algorithm is provided. The digital signal processor includes an instruction fetching unit that fetches instructions; a decoding unit that decodes the instructions fetched by the instruction fetching unit, and an execution unit that executes the instructions decoded by the decoding unit. The execution unit includes a first comparing unit that compares first data with second data and a second comparing unit that compares third data with fourth data. The first comparing unit and the second comparing unit operate in parallel. Also, the first data, the second data, the third data, and the fourth data can each be one of four results obtained by adding one of two path metrics to one of two branch metrics. The execution unit outputs any two new path metrics in a high order position and a low order position respectively.

10 Claims, 28 Drawing Sheets

U.S. PATENT DOCUMENTS

| | | |
|---|---|---|
| 5,027,374 A | 6/1991 | Rossman |
| 5,220,570 A | 6/1993 | Lou et al. |
| 5,327,440 A | 7/1994 | Fredrickson et al. |
| 5,375,129 A | 12/1994 | Cooper |
| 5,379,306 A | 1/1995 | Noma et al. |
| 5,414,738 A | 5/1995 | Bienz |
| 5,502,735 A | 3/1996 | Cooper |
| 5,509,021 A | 4/1996 | Todoroki |
| 5,633,897 A | 5/1997 | Fettweis et al. |
| 5,710,784 A | 1/1998 | Kindred et al. |
| 5,742,621 A | 4/1998 | Emon et al. |
| 5,809,071 A | 9/1998 | Kobayashi et al. |
| 5,881,106 A * | 3/1999 | Cartier ........................ 375/262 |
| 5,912,908 A * | 6/1999 | Cesari et al. ................ 714/795 |
| 5,923,713 A | 7/1999 | Hatakeyama |
| 5,987,490 A | 11/1999 | Alidina et al. |
| 6,125,153 A | 9/2000 | Sugisawa et al. |
| 6,195,782 B1 * | 2/2001 | Rahmatullah et al. ...... 714/796 |
| 6,257,756 B1 * | 7/2001 | Zarubinsky et al. ........ 714/795 |
| 6,263,474 B1 | 7/2001 | Watanabe |
| 6,330,684 B1 | 12/2001 | Yamanaka et al. |
| 6,477,661 B2 * | 11/2002 | Yamanaka et al. ............. 714/1 |

OTHER PUBLICATIONS

English language abstract of JP 9–148943.
English language abstract of JP 63–215227.
English Language Abstract of JP 6–164423.
English Language Abstract of JP 8–84082.
English Language Abstract of JP 9–148943.
English Language Abstract of JP 10–707651.
English Language Abstract of JP 10–209882.
English Language Abstract of JP 11–55130.
English Language Translation for JP Appln. No. 09–148943.

* cited by examiner

FIG. 3

| J | B(J, 0) | B(J, 1) |
|---|---|---|
| 0 | 1 | 1 |
| 1 | −1 | −1 |
| 2 | 1 | 1 |
| 3 | −1 | 1 |
| 4 | 1 | −1 |
| 5 | −1 | 1 |
| 6 | 1 | −1 |
| 7 | −1 | 1 |

FIG. 4

```
VITRFE  MACRO
        DADST   *AR5, A         ;A=OLD_M(2J)+T//OLD_(2J+1)−
        DSADT   *AR5+, B        ;B=OLD_M(2J)−T//OLD_(2J+1)+
        CMPS    A, *AR4+        ;NEW_M(J)=MAX(A_HIGH, A_LOW
                                ;TRN<<1, TRN(0, 0)=TC
                :
        CMPS    B, *AR3+        ;NEW_M(J+8)=MAX(B_HIGH, B_LC
                                ;TRN<<1, TRN(0, 0)=TC
        .ENDM

VITRFE  MACRO
        DSADT   *AR5, A         ;A=OLD_M(2J)−T//OLD_(2J+1)+
        DADST   *AR5+, B        ;B=OLD_M(2J)+T//OLD_(2J+1)−
        CMPS    A, *AR4+        ;NEW_M(J)=MAX(A_HIGH, A_LOW
                                ;TRN<<1, TRN(0, 0)=TC
                :
        CMPS    B, *AR3+        ;NEW_M(J+8)=MAX(B_HIGH, B_LC
                                ;TRN<<1, TRN(0, 0)=TC
        .ENDM
```

T: DELAY

G0G1

BM0 : BRANCH METRIC WITH 0 0
BM1 : BRANCH METRIC WITH 0 1
BM2 : BRANCH METRIC WITH 1 0
BM3 : BRANCH METRIC WITH 1 1

FIG. 17

| | COMPARING MEANS 5 | COMPARING MEANS 9 |
|---|---|---|
| NODE N0, NODE N1→NODE N'0 | PM1+BM1−PM0−BM0 | — |
| NODE N0, NODE N1→NODE N'4 | — | PM1+BM0−PM0−BM1 |
| NODE N6, NODE N7→NODE N'3 | PM7+BM0−PM6−BM1 | — |
| NODE N6, NODE N7→NODE N'7 | — | PM7+BM1−PM6−BM0 |

| | COMPARING MEANS 6 | COMPARING MEANS 10 |
|---|---|---|
| NODE N0, NODE N1→NODE N'0 | PM1+BM1, PM0+BM0 | — |
| NODE N0, NODE N1→NODE N'4 | — | PM1+BM0, PM0+BM1 |
| NODE N6, NODE N7→NODE N'3 | PM7+BM0, PM6+BM1 | — |
| NODE N6, NODE N7→NODE N'7 | — | PM7+BM1, PM6+BM0 |

FIG. 21

| INPUT | | | | | OUTPUT | | |
|---|---|---|---|---|---|---|---|
| in0 | in1 | in2 | in3 | 0in | out0 | out1 | 0out |
| 0 | 0 | 0 | 0 | 0 | 0 | 0 | 0 |
| 0 | 0 | 0 | 1 | 0 | 1 | 0 | 0 |
| 0 | 0 | 1 | 0 | 0 | 1 | 0 | 0 |
| 0 | 0 | 1 | 1 | 0 | 0 | 1 | 0 |
| 0 | 1 | 0 | 0 | 0 | 1 | 0 | 0 |
| 0 | 1 | 0 | 1 | 0 | 0 | 1 | 0 |
| 0 | 1 | 1 | 0 | 0 | 0 | 1 | 0 |
| 0 | 1 | 1 | 1 | 0 | 1 | 1 | 0 |
| 1 | 0 | 0 | 0 | 0 | 1 | 0 | 0 |
| 1 | 0 | 0 | 1 | 0 | 0 | 1 | 0 |
| 1 | 0 | 1 | 0 | 0 | 0 | 1 | 0 |
| 1 | 0 | 1 | 1 | 0 | 1 | 1 | 0 |
| 1 | 1 | 0 | 0 | 0 | 0 | 1 | 0 |
| 1 | 1 | 0 | 1 | 0 | 1 | 1 | 0 |
| 1 | 1 | 1 | 0 | 0 | 1 | 1 | 0 |
| 1 | 1 | 1 | 1 | 0 | 0 | 1 | 1 |
| 0 | 0 | 0 | 0 | 1 | 1 | 0 | 0 |
| 0 | 0 | 0 | 1 | 1 | 0 | 1 | 0 |
| 0 | 0 | 1 | 0 | 1 | 0 | 1 | 0 |
| 0 | 0 | 1 | 1 | 1 | 1 | 1 | 0 |
| 0 | 1 | 0 | 0 | 1 | 0 | 1 | 0 |
| 0 | 1 | 0 | 1 | 1 | 1 | 1 | 0 |
| 0 | 1 | 1 | 0 | 1 | 1 | 1 | 0 |
| 0 | 1 | 1 | 1 | 1 | 0 | 1 | 1 |
| 1 | 0 | 0 | 0 | 1 | 0 | 1 | 0 |
| 1 | 0 | 0 | 1 | 1 | 1 | 1 | 0 |
| 1 | 0 | 1 | 0 | 1 | 1 | 1 | 0 |
| 1 | 0 | 1 | 1 | 1 | 0 | 1 | 1 |
| 1 | 1 | 0 | 0 | 1 | 1 | 1 | 0 |
| 1 | 1 | 0 | 1 | 1 | 0 | 1 | 1 |
| 1 | 1 | 1 | 0 | 1 | 0 | 1 | 1 |
| 1 | 1 | 1 | 1 | 1 | 1 | 1 | 1 |

PROCESSING UNIT AND PROCESSING METHOD

CROSS-REFERENCE TO RELATED APPLICATIONS

This Application is a continuation of U.S. patent application Ser. No. 09/974,807, filed on Oct. 12, 2001 U.S. Pat. No. 6,477,661, which is a division of U.S. patent application Ser. No. 09/147,663, filed on Feb. 9, 1999 U.S. Pat. No. 6,330,684, which is the National Stage of International Application No. PCT/JP98/02909, filed on Jun. 29, 1998, the contents of which are incorporated by reference herein in their entireties. The International Application was not published in English.

TECHNICAL FIELD

The present invention relates to a processing unit, which is incorporated into a mobile communication apparatus, for performing an ASC (Addition, Comparison, and Selection) operation of particularly a Viterbi decoding.

BACKGROUND ART

In data communications in a mobile radio communication network, since a bit error frequently occurs, an execution of an error correction processing is needed. In the error correction methods, there is a method in which a convolutional code generated from an input bit is decoded by Viterbi decoding on a receiver side. In the error correction processing, a digital signal processor (hereinafter referred to as "DSP") is used.

The Viterbi decoding repeats the simple processing such as addition, comparison, and selection and performs a traceback operation for finally data, thereby realizing a maximum likelihood decoding of the convolutional code.

The following will briefly explain the Viterbi decoding processing. The convolutional code is generated by mode 2 addition of input bits and a fixed number of bits precedent thereto. Then, a plurality of coding data is generated to correspond to one bit of the input bits. A number of input information bits having influence upon the coding data is called constraint length (K). The number of input information bits is equal to a number of stages of shift registers used in mode 2 addition.

The coding data is determined by the input bits and a state of the preceding (K−1) input bits. When a new information bit is input, the state of the input bits transits to a new state. The state in which coding data transits is determined by whether the new input bit is "0" or "1." Since the respective (K−1) bits are "1" or "0", a number of states in which coding data transits becomes $2^{(K-1)}$.

In the Viterbi decoding, received coding data sequence is observed, and the most-likely state is estimated from all obtainable state transitions. For this reason, every time when coding data (received data sequence) corresponding to one bit of information bits, an inter-signal distance (metric) of the respective paths to each state at that point is computed. Then, operations for leaving a path having a smaller metric among the paths reaching the same state as a survivor are sequentially repeated.

As shown in a state transition diagram of FIG. 1, in a convolutional encoder having a constraint length K, two paths each showing a state transition from each of state S[n] and $S[n+2^{(K-2)}]$ at one previous point extend to a state S[2n] (n=positive integer) at a certain point. For example, in a case of K=3, a transition from each of S[1] (state S01) and S[3] (state S11) to S[2] (state S10)(state in which preceding two bits are input in order of "1" and "0") at the time of n=1 is possible. Also, at the time of n=2, a transition from each of S[2] (state S10) and S[4] (state S00) to S[4] (state S00)(state shown by low-order two bits) is possible.

A path metric "a" is a sum of an inter-signal distance (branch metric) "x" between an output symbol of the path inputting to the state S[2n] and the received data sequence and a path metric "A." The path metric "A" is the total sum of branch metrics of the survivor paths up to the state S[n] at one previous state. Similarly, a path metric "b" is a sum of an inter-signal distance (branch metric) "y" between an output symbol of the path inputting to the state S[2n] and the received data sequence and a path metric "B." The path metric "B" is the total sum of branch metrics of the survivor paths up to the state $S[n+2^{(K-2)}]$ at one previous point. In the Viterbi decoding, the path metrics "a" and "b" inputting to the state S[2n] are compared with each other, and the smaller path is selected as a survivor path.

In the Viterbi decoding, each processing of addition for obtaining the path metric, comparison between the path metrics and the selection of path is executed with respect to $2^{(K-2)}$ states at each point. Moreover, in the selection of path, a history showing which path has been selected is left as a path select signal PS[i], [I=0 to $2^{(K-2)}-1$].

At this time, if a subscript (e.g., n) of one previous state of the selected path is smaller than a subscript $(n+2^{(K-2)})$ of one previous state of the non-selected other path, PS[i]=0 is established. If the subscript (n) it is larger than the subscript $(n+2^{(K-2)})$, PS[i]=1 is established.

In the case of FIG. 1, since $n<(n+2^{(K-2)})$ is established, the state $S[n+2^{(K-2)}]$ is selected at the time of a>b and PS[S2n]=1 is established, and the state S[n] is selected at the time of a≦b and PS[S2n]=0 is established.

Then, in the Viterbi decoding, data is decoded while being traced back to the path finally survived based on the path select signal.

The following will explain the conventional processing unit for Viterbi decoding, TMS320C54x, which is a general processing unit, (manufactured by TEXAS INSTRUMENTS, hereinafter referred to as "C54x") being given as one example. In a GSM cellular radio system, equation (1) set forth below is used as a convolutional code.

$G1(D)=1+D3+D4$ $G2(D)=1+D+D3+D4$ \hfill (1)

The above convolutional code is expressed by a trellis diagram of a butterfly structure shown in FIG. 2. The trellis diagram shows a state in which the convolutional code transits from a certain state to another state. Let us assume that constraint length K is 5. States of $2^{(K-2)}=16$ or 8 butterfly structures are present for each symbol section. Then, two branches are input in each state, and a new path metric is determined by the ACS operations.

The branch metric can be defined as the following equation (2).

$M=SD(2*1)*B(J,0)+SD(2*i+1)*B(j,1)$ \hfill (2)

where SD(2*i) denotes a first symbol of a symbol metric showing a soft decision input, and SD(2*i+1) denotes a second symbol of the symbol metric. B(J,0) and B(j,1) conform to codes generated by a convolutional encoder as shown in FIG. 3.

In C54x, an arithmetic logic section (hereinafter referred to as "ALU") is set to a dual 16-bit mode, thereby processing the butterfly structure at high speed. The determination of a new path metric (j) can be obtained by calculating two path metrics (2*J and 2*J+1) and the branch metrics (M and −M) in parallel based on a DSADT instruction and executing a comparison based on a CMPS instruction. The determination of a new path metric (j+8) can be obtained by calculating two path metrics and the branch metrics (M and −M) in parallel based on the DSADT instruction. The calculation results are stored in high and low order bits of a double-precision accumulator, respectively.

The CMPS instruction compares the high and low order bits of the accumulator and stores a larger value in a memory. Also, every time when the comparison is executed, which value is selected is written in a 16-bit transition register (TRN). The content written to the TRN is stored in the memory every time when each symbol processing is ended. Information to be stored in the memory is used to search a suitable path in the trace-back processing. FIG. 4 shows a macro program for a butterfly operation of the Viterbi decoding.

The values of the branch metrics are stored in the T register before the macro is called. FIG. 5 shows an example of a memory mapping of the path metrics.

8 butterfly operations are executed in one symbol section and 16 new states are obtained. This series of processing is repeatedly computed over several sections. After the end of the processing, the trace-back is executed so as to search a suitable path from 16 paths. Thereby, a decoding bit sequence can be obtained.

The mechanism of the ACS operations of the C54x, which is the general DSP, can be thus explained. Then, in C54x, and the updates of two path metrics are realized with 4 machine cycles from the example of the macro program of FIG. 4.

In the future, there is expected an increase in demand for non-voice communications requiring high quality transmission with a lower bit error rate than voice communications. As means for achieving the low bit error rate, there is means for increasing the constraint length K of the Viterbi decoding.

However, if the constraint length is increased by a value corresponding to one bit, a number of path metrics (number of states) doubles. For this reason, a number of operations in the Viterbi decoding using DSP double. Generally, an amount of information in non-voice communications is larger than the amount of information in voice communications. If the amount of information increases, the number of operations in the Viterbi decoding including the ACS operation also increases. An increase in number of operations using DSP makes it difficult to maintain a battery for a portable terminal for a long period of time.

For the purpose of downsizing the portable terminal, reducing the weight, and lowering the cost, an area processed by a special LSI has been also designed to be implemented in one chip form using a DSP processing in recent years.

However, an increase in the number of operations using DSP exceeds the processing capability of the existing DSP, thereby making it impossible to be implemented in one chip form using DSP.

Moreover, if the function of DSP is highly enhanced to increase the number of operations, an increase in the cost of DSP itself is brought about. As a result, the reduction in the cost of the portable terminal cannot be realized.

DISCLOSURE OF INVENTION

A first object of the present invention is to provide a processing unit for efficiently processing an ACS operation of the Viterbi decoding by use of DSP with a small investment in software.

The above object can be attained by arranging two pairs of comparing sections, an adding section, and a storing section for storing a comparison result in the processing unit and by executing the ACS operation in parallel.

BRIEF DESCRIPTION OF DRAWINGS

Figure 3:
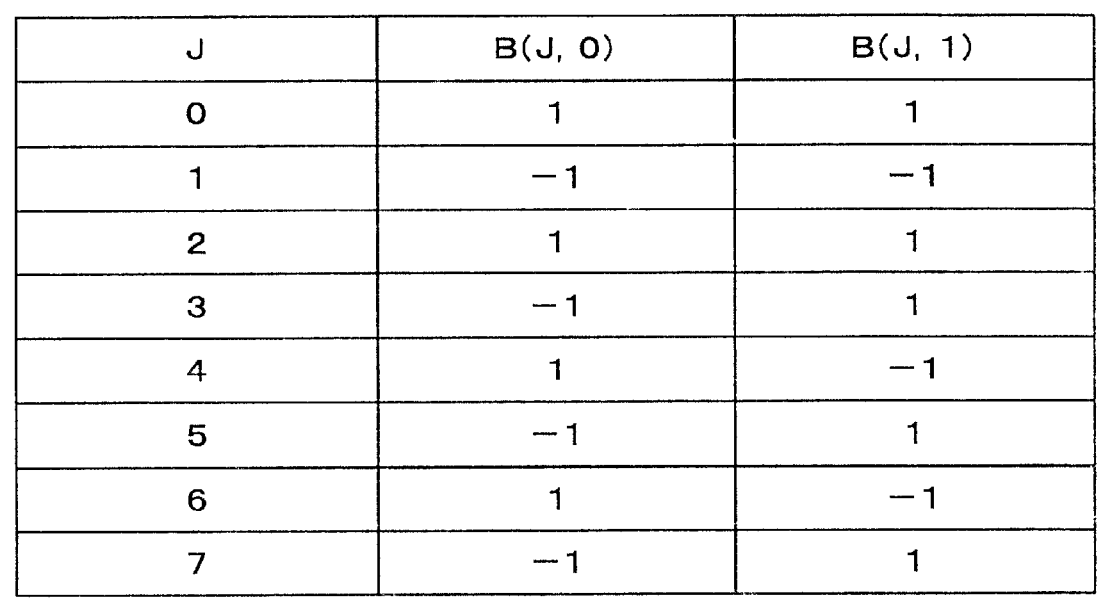

FIG. 3 is a schematic view showing an example of codes generated by the convolutional encoder;

FIG. 4 is a program view showing an example of a Viterbi operation for channel coding;

FIG. 17 is a view showing ACS operation results of the processing unit of the sixth embodiment of the present invention;

FIG. 21 is an input/output view of a 4:2 compressor of the eighth embodiment of the present invention;

BEST MODE FOR CARRYING OUT THE INVENTION

Embodiments of the present invention will now be described with reference to the accompanying drawings.

(First Embodiment)

Figure 1:
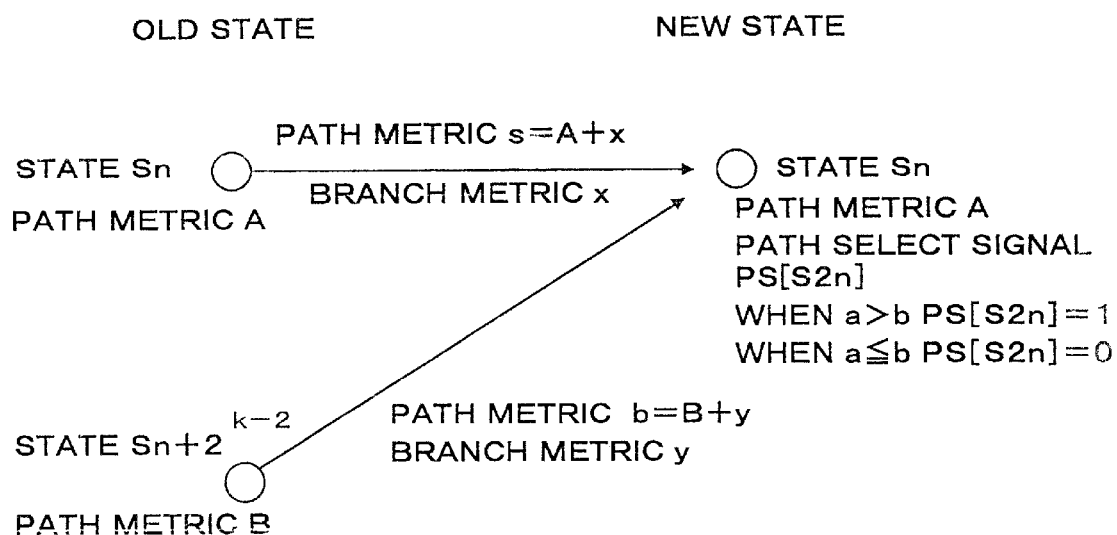
FIG. 1 is a trellis diagram showing a path of a state transition of a convolutional encoder in Viterbi decoding.
Figure 2:
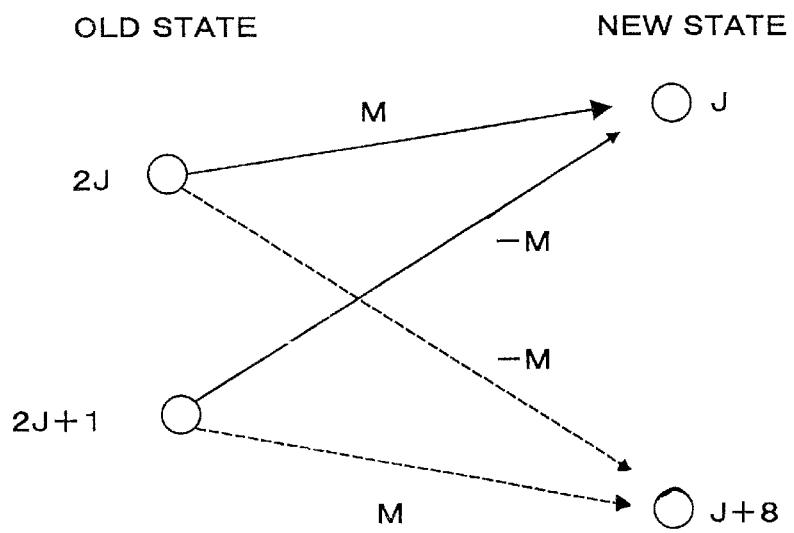
FIG. 2 is a schematic diagram showing a butterfly structure of the trellis diagram.
Figure 5:
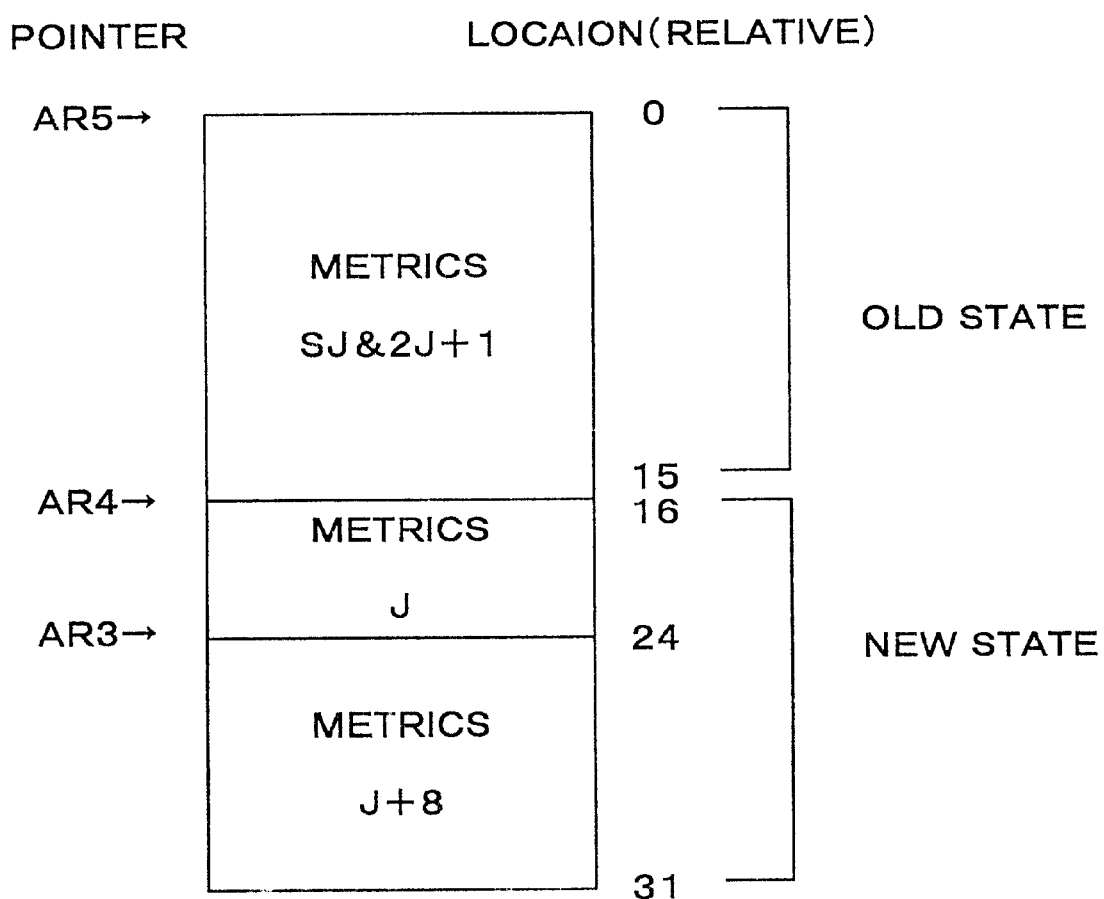
FIG. 5 is a schematic view showing a pointer control and an example of path metric storage.
Figure 6:
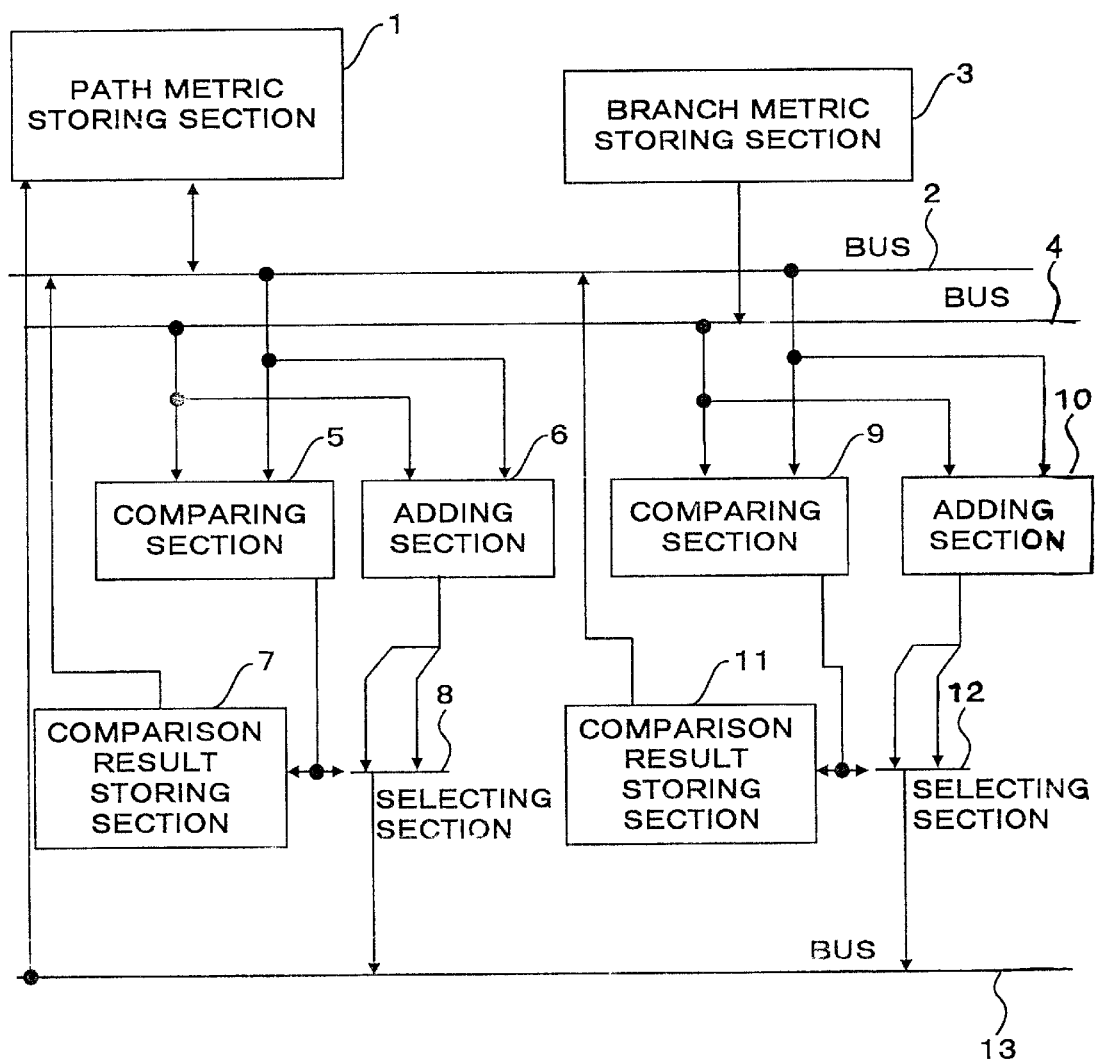
FIG. 6 is a block diagram showing the structure of the processing unit of the first embodiment of the present invention.

FIG. 6 is a block diagram showing the structure of the processing unit of the first embodiment of the present invention. In FIG. 6, a path metric storing section 1 stores path metrics, and a data supply and a transfer of an operation result are executed via a bus 2. A branch metric storing section 3 stores branch metrics and a data supply is executed via a bus 4.

Comparing sections 5 and 9 compare data input from the path metric storing section 1and the branch metric storing section 3 via the buses 2 and 4, respectively.

Adding sections 6 and 10 add data read from the path metric storing section 1 and the branch metric storing section 3 via the buses 2 and 4, respectively.

A comparison result storing section 7 stores a comparison result of the comparing section 5, and a comparison result storing section 11 stores a comparison result of the comparing section 9. Then, the comparison result storing sections 7 and 11 transfer the comparison results in the path metric storing section 1 via the bus 2.

A selecting section 8 inputs an adding result of the adding section 6 and determines an output based on the comparison result of the comparing section 5. A selecting section 12 inputs an adding result of the adding section 10 and determines an output based on the comparison result of the comparing section 9. Then, the selecting sections 8 and 12 transfer the outputs determined based on the comparison results to the path metric storing section 1 via a bus 13.

Next, the following will explain ACS operation of the processing unit of the first embodiment with reference to the drawings. In the explanation set forth below, it is assumed that data to be decoded is ones that are coded by a convolutional encoder of FIG. 7 where a constraint length K=4 and a code rate ½. Also, data type of the path metrics and that of the branch metrics are single-precision data. Then, when double-precision data is set to (X, Y) for the sake of convenience, a high order position of the double-precision data is set to X and a low order position thereof is set to Y.

Four branch metrics are set to BM0, BM1, BM2, BM3, respectively. If a state transition is illustrated using these branch metrics, the butterfly structure is shown as in FIG. 8.

Here, attention should be paid to nodes N0 and N1 of an old state. The transition destinations of the nodes N0 and N1 are nodes N'0 and N'4, respectively.

Then, a branch metric, which is obtained at the time of the transition from the node N0 to the node N'0, is BM0, and a branch metric, which is obtained at the time of the transition from the node N1 to the node N'0, is BM1. Also, a branch metric, which is obtained at the time of the transition from the node N0 to the node N'4, is BM1, and a branch metric, which is obtained at the time of the transition from the node N1 to the node N'4, is BM0.

Thus, the path metric PM0 of the node N0 and the path metric PM1 of the node N1 are replaced with branch metrics BM0 and BM1, respectively, and these metrics are added. Thereby, path metric PM'0 of the node N'0 and path metric PM'4 of the node N'4 are obtained.

Then, this relationship can be applied to the other pairs of nodes (a pair of nodes N2 and N3, a pair of nodes N4 and N5, a pair of nodes N6 and N7).

The inventor of the present invention paid attention to this relationship, and found out that two path metrics could be updated simultaneously by processing the ACS operation in parallel and that processing time could be reduced. This led to the present invention.

The ACS operation of the node N'0 to N'3 in the first half is executed by the comparing section 5, the adding section 6, the comparison result storing section 7, and the selecting section 8. In parallel with this operation, the ACS operation of the node N'4 to N'8 in the second half is executed by the comparing section 9, the adding section 10, the comparison result storing section 11, and the selecting section 12. The following will specifically explain the ACS operation from nodes N0 and N1 to nodes N'0 and N'4.

First, two path metrics (PM1, PM0) are output to the bus 2 from the path metric storing section 1. On the other hand, two branch metrics (BM1, BM0) are output to the bus 4 from the branch metric storing section 3.

The comparing section 5 inputs two path metrics (PM1, PM0) from the bus 2 and two branch metrics (BM1, BM0) from the bus 4 so as to calculate PM1+BM1−PM0−BM0.

The adding section 6 inputs two path metrics (PM1, PM0) from the bus 2 and two branch metrics (BM1, BM0) from the bus 4 so as to calculate PM1+BM1 and PM0+BM0. Then, the calculation results (as PM1+BM1, PM0+BM0) are output to the selecting section 8.

The selecting section 8 inputs the most significant bit (hereinafter referred to as "MSB") which is the code bit of the comparison result of the comparing section 5, PM1+BM1−PM0−BM0. Then, the selecting section 8 selects as to whether the high order PM1+BM1 is output to the bus 13 or the low order PM0+BM0 is output thereto from the value of the MSB.

In other words, if the equation (3) shown below is established, the MSB is 0 and the selecting section 8 outputs the low order PM0+BM0 to the bus 13 as PM'0. Conversely, if the equation (3) is not established, the MSB is 1 and the selecting section 8 outputs the high order PM1+BM1 thereto as PM'0.

$$PM1+BM1 \geq PM0+BM0 \qquad (3)$$

Also, the MSB, which is the comparison result of the comparing section 5, is stored in the comparison result storage section 7 at the same time.

The comparing section 9 inputs two path metrics (PM1, PM0) from the bus 2 and two branch metrics (BM1, BM0) from the bus 4 so as to calculate PM1+BM0−PM0−BM1.

The adding section 10 inputs two path metrics (PM1, PM0) from the bus 2 and two branch metrics (BM1, BM0) from the bus 4 so as to calculate PM1+BM0 and PM0+BM1. Then, the calculation results (as PM1+BM0, PM0+BM1) are output to the selecting section 12.

The selecting section 12 inputs the MSB of the comparison result of the comparing section 9, PM1+BM1−PM0−BM1. Then, the selecting section 12 selects as to whether the high order PM1+BM0 is output to the bus 13 or the low order PM0+BM1 is output thereto from the value of the MSB.

In other words, if the equation (4) shown below is established, the MSB is 0 and the selecting section 12 outputs the low order PM0+BM1 to the bus 13 as PM'4. Conversely, if the equation (4) is not established, the MSB is 1 and the selecting section 12 outputs the high order PM1+BM0 thereto as PM'4.

$$PM1+BM0 \geq PM0+BM1 \tag{4}$$

Also, the MSB, which is the comparison result of the comparing section 9, is stored in the comparison result storage section 11 at the same time.

The above processing is subjected to the other node pairs in the same way. As a result, the ACS operation of the Viterbi coding using DSP can be executed in parallel and the operation processing can be performed with relatively a small amount of processing at high speed.

The above embodiment explained the case of the constraint length K=4 and the code rate ½. However, even if the constraint length and the code rate are the other values, the above relationship is established. Therefore, the change corresponding thereto is suitably provided, so that the same advantage can be obtained.

(Second Embodiment)

Figure 9:
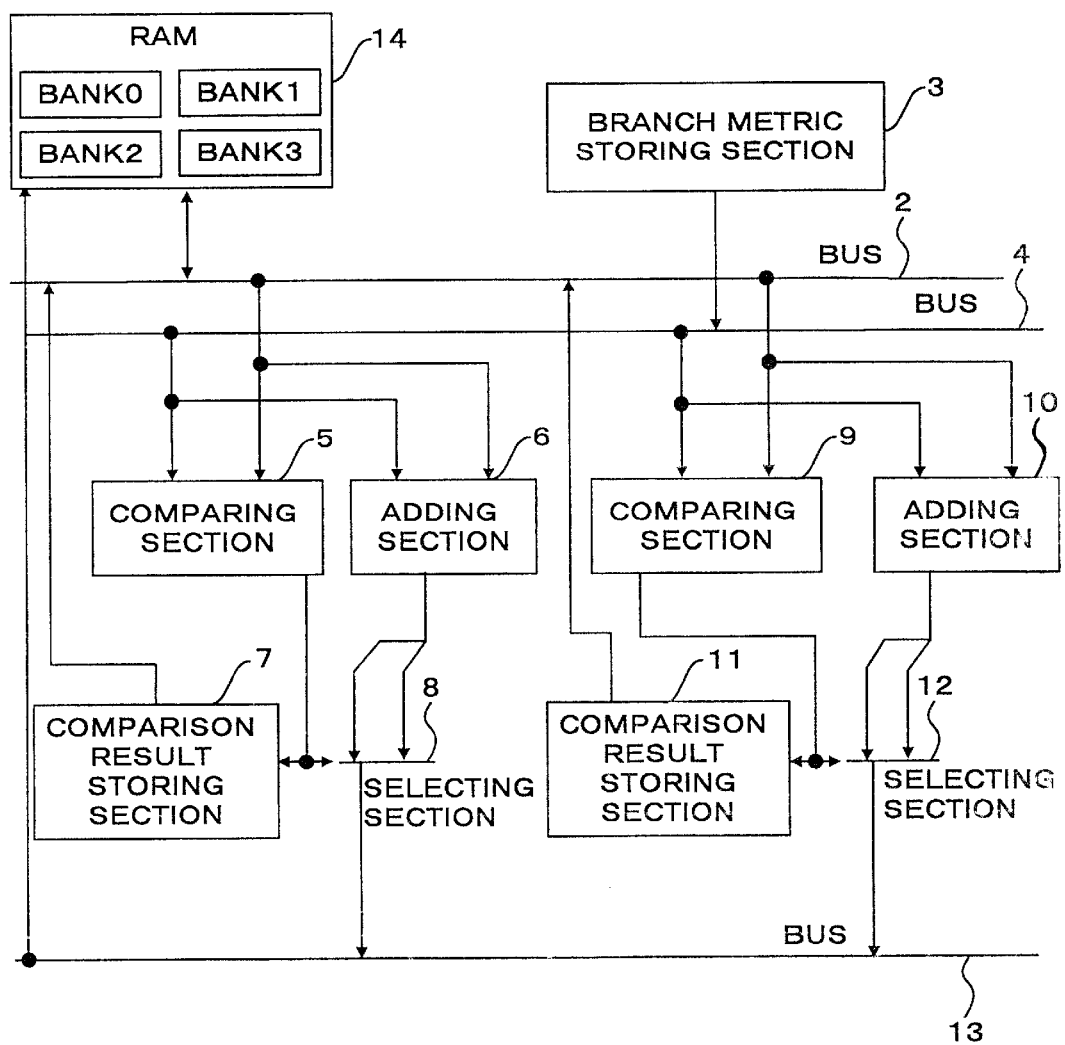
FIG. 9 is a block diagram showing the structure of the processing unit of the second embodiment of the present invention.

FIG. 9 is a block diagram showing the structure of the processing unit of the second embodiment of the present invention. In the processing unit of FIG. 9, the same reference numerals are added to the portions common to the processing unit of FIG. 6 and the explanation is omitted.

In the processing unit of FIG. 9, the storing section for storing the path metrics is formed by a RAM 14 having four banks.

Figure 10:
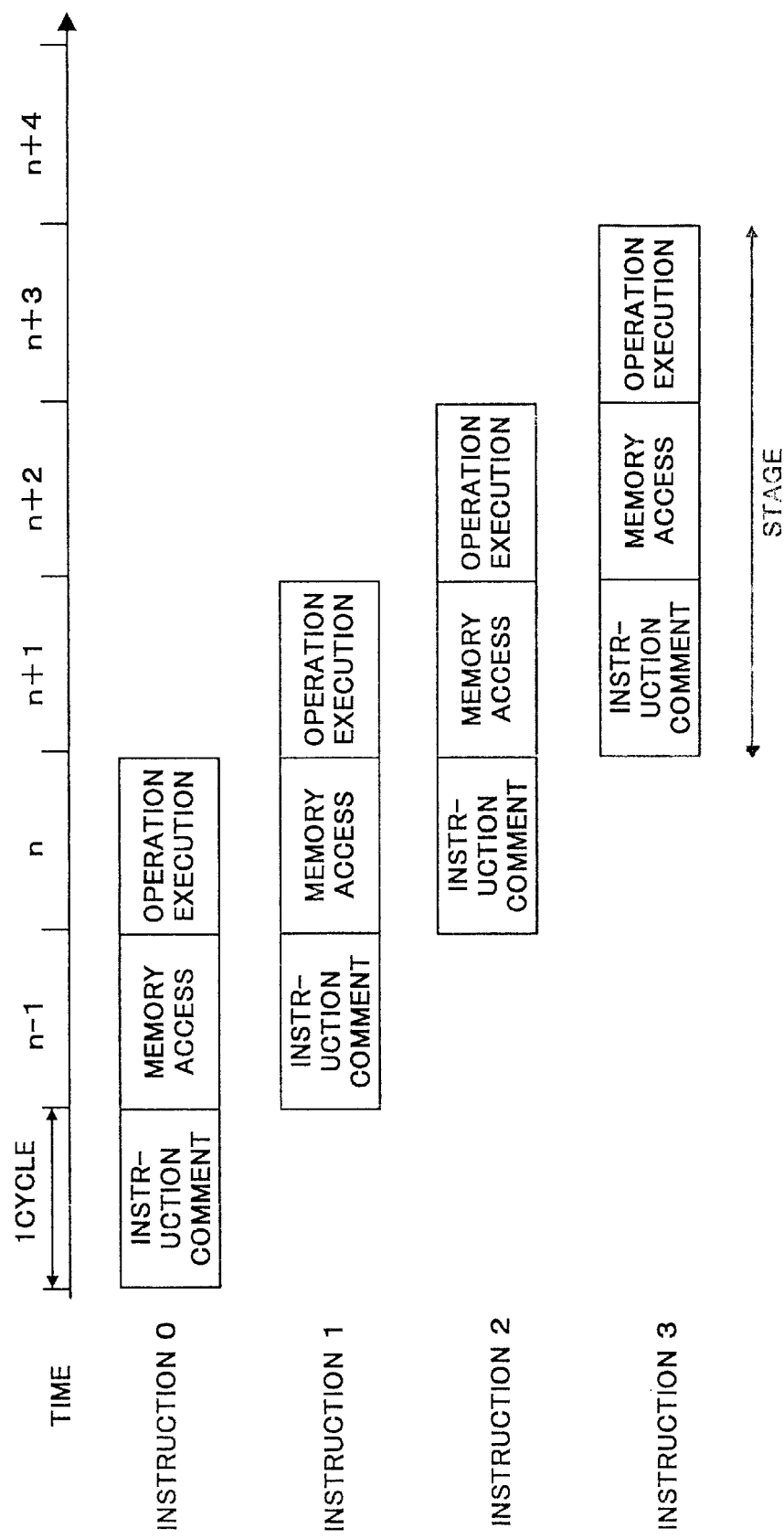
FIG. 10 is a timing view explaining a pipe line operation of the processing unit of the second embodiment of the present invention.

The processing unit of FIG. 9 is suitable for the operation processing of a pipeline structure shown in FIG. 10.

For example, for executing the ACS operation at an operation execution stage of n-th+1 cycle in an instruction 1, it is required that addresses of the path metrics to be read at a memory access stage of n-th cycle should be supplied to the RAM 14 in advance.

It is assumed that the RAM 14 is a double-precision readable RAM that can read an even address and an odd address continuously. Then, if the following conditions (a) and (b) are satisfied, two path metrics used in the operation can be read by only designating the even address.

(a) The path metrics of one state are stored at continuous addresses in order of the even address and the odd address.

(b) The path metrics of one state are divided into the first and second halves, and each is stored in a different bank.

For example, the path metrics (PM0, PM1, PM2, PM3 in FIG. 8) of the first half of the old state are stored in the bank 0 of the RAM 14. Then, the path metrics (PM4, PM5, PM6, PM7 in FIG. 8) of the second half of the old state are stored in the bank 1. In this case, two path metrics are generated by executing the ACS operation at one cycle, and these metrics are stored in banks 2 and 3 via the bus 13, respectively. At this time, double-precision data is transferred from the bus 13, the path metric of the node N'3 is stored in the bank 2 from the node N'0, and the path metric of the node N'7 is stored in the bank 3 from the node N'.

Figure 8:
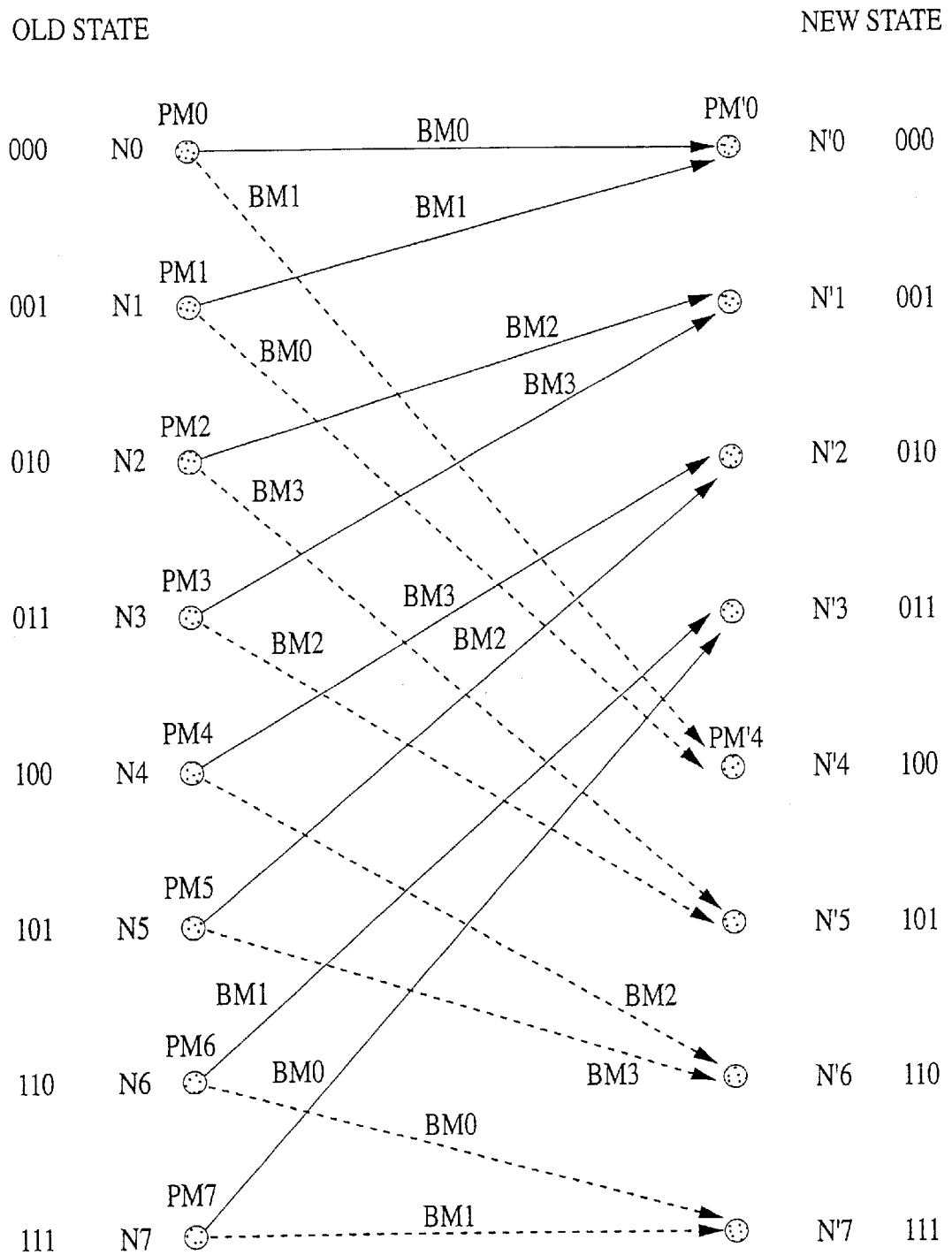
FIG. 8 is a schematic view showing the butterfly structure where a constraint length K=4.
Figure 11:
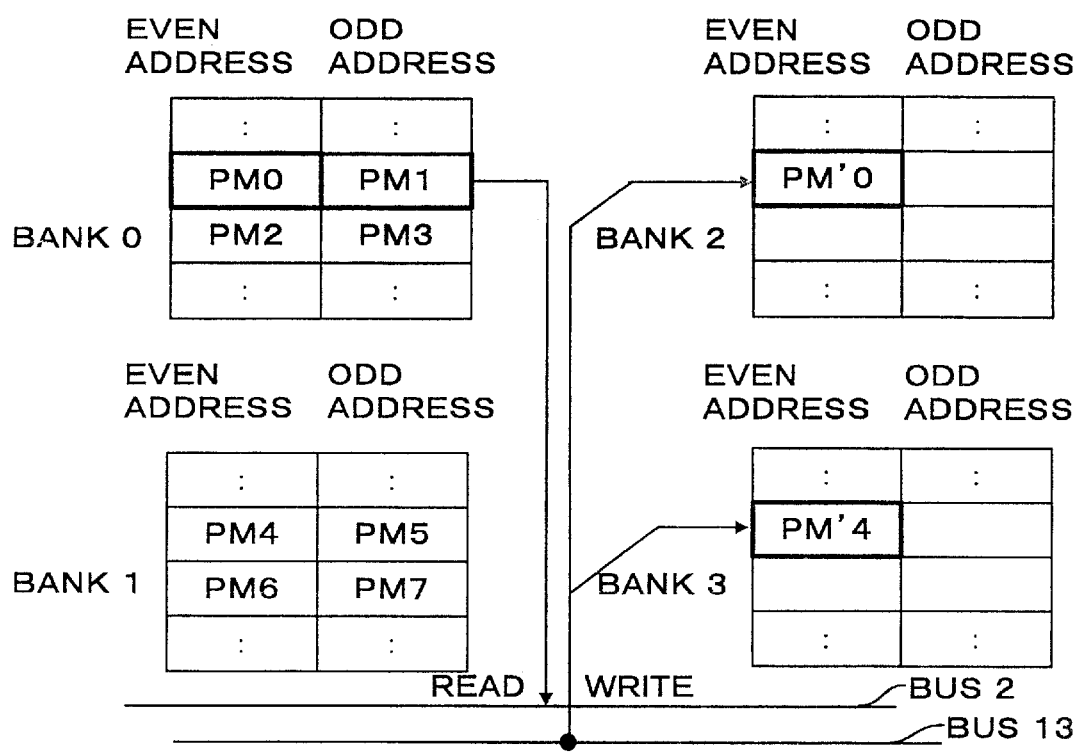
FIG. 11 is a schematic view showing an example of a memory access operation of RAM of the second embodiment of the present invention.

FIG. 11 is a schematic view showing an example of a memory access operation of the RAM 14 corresponding to FIG. 8.

When the ACS operation of one state is ended, in a next state, the path metrics of the old state are read from the banks 2 and 3 and the path metrics of a new state are stored in the banks 0 and 1.

Thus, every time when the ACS operation of one state is ended, the pair of banks for reading the path metrics and the pair of banks for storing the path metrics are switched using RAM 14 having four banks as the storing section for storing the path metrics. Thereby, the ACS operation of the Viterbi decoding using DSP can be executed in parallel.

In the above explanation, the banks 0 and 1 and the banks 2 and 3 were paired, respectively. However, even if the other combinations are used, the similar operation can be executed by only changing the address to be used in supplying the metrics at the memory access stage and the address to be used in storing the metrics. Moreover, in the second embodiment, the RAM 14 was formed by four banks. However, the similar operation can be executed if the number of banks is more than four.

(Third Embodiment)

Figure 12:
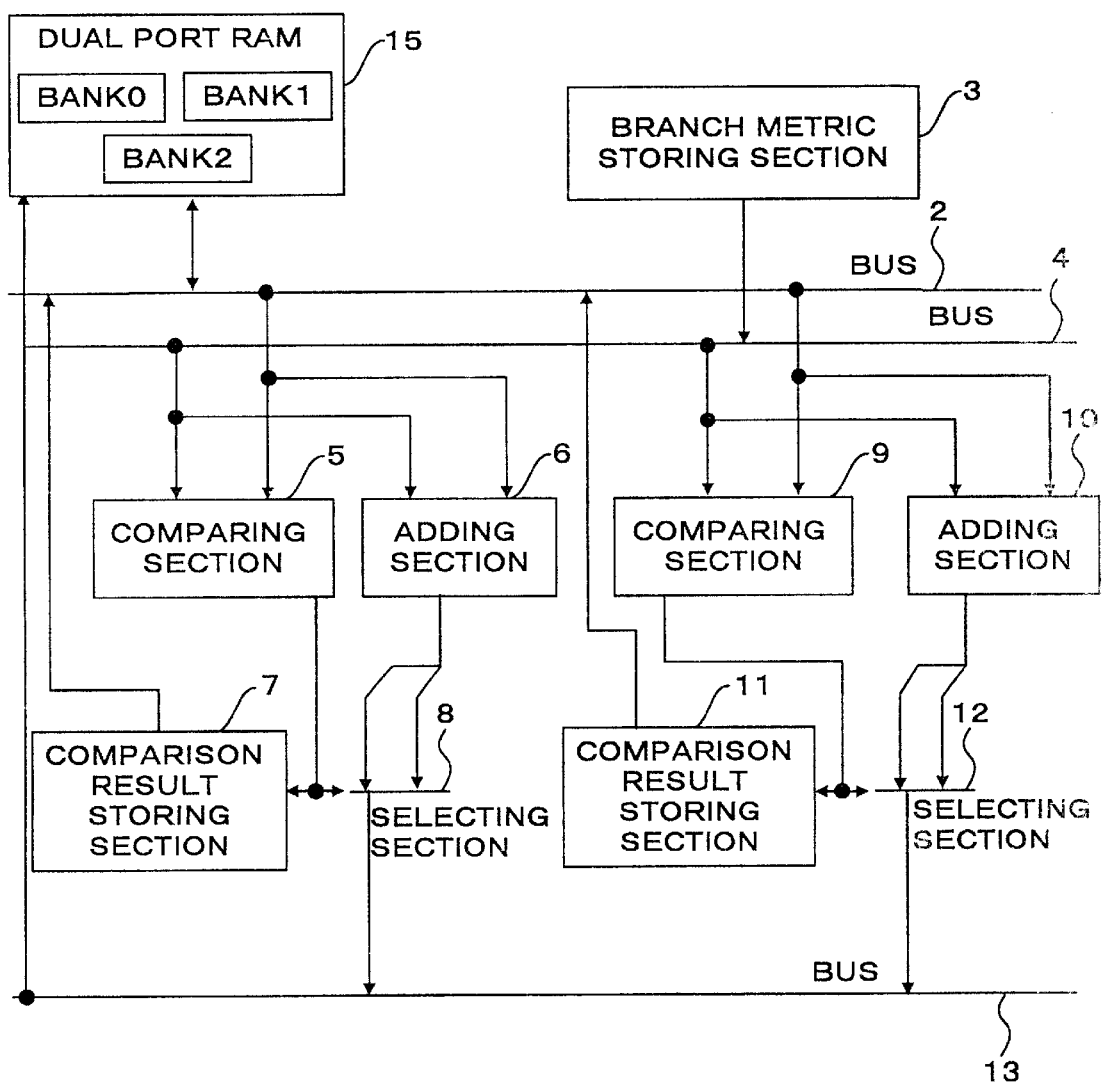
FIG. 12 is a block diagram showing the structure of the processing unit of the third embodiment of the present invention.

FIG. 12 is a block diagram showing the structure of the processing unit of the third embodiment of the present invention. In the processing unit of FIG. 12, the same reference numerals are added to the portions common to the processing unit of FIG. 6 and the explanation is omitted.

In the processing unit of FIG. 12, the storing section 3 for storing the path metrics is formed by a dual RAM 15 having three banks.

The processing unit of FIG. 12 is suitable for the operation processing of the pipe line structure shown in FIG. 10.

Since the storing section for storing the path metrics is the dual port RAM 15 in the processing unit of FIG. 12, designation of reading and writing to the same bank can be executed with one instruction. For example, for executing the ACS operation at an operation execution stage of n-th+1 cycle in an instruction 1, an address for reading the path metric at a memory access stage of n-th cycle and an address for writing the path metric are supplied to the dual port RAM 15. Thereby, at the n-th+1 cycle, an even address and an odd address can be continuously read from the dual port RAM 15 so as to execute the ACS operation. Moreover, one path metric can be written to the same bank.

In the processing unit of the third embodiment, if the following conditions (a) and (b) are satisfied, two path metrics used in the operation can be read by only designating the even address.

(a) The path metrics of one state are stored at continuous addresses in order of the even address and the odd address.

(b) The path metrics of one state are divided into the first and second halves, and each is stored in a different bank.

For example, the path metrics (PM0, PM1, PM2, PM3 in FIG. 8) of the first half of the old state are stored in the bank 0 of the dual port RAM 15, and the path metrics (PM4, PM5, PM6, PM7 in FIG. 8) of the second half of the old state are stored in the bank 1. In this case, two path metrics are generated by executing the ACS operation at one cycle, and these metrics are stored in banks 0 and 2 via the bus 13, respectively. At this time, the bus 13 transfers double-precision data, the path metric of the node N'3 is stored in the bank 0 from the node N'0, and the path metric of the node N'7 is stored in the bank 2 from the node N'4.

Figure 13:
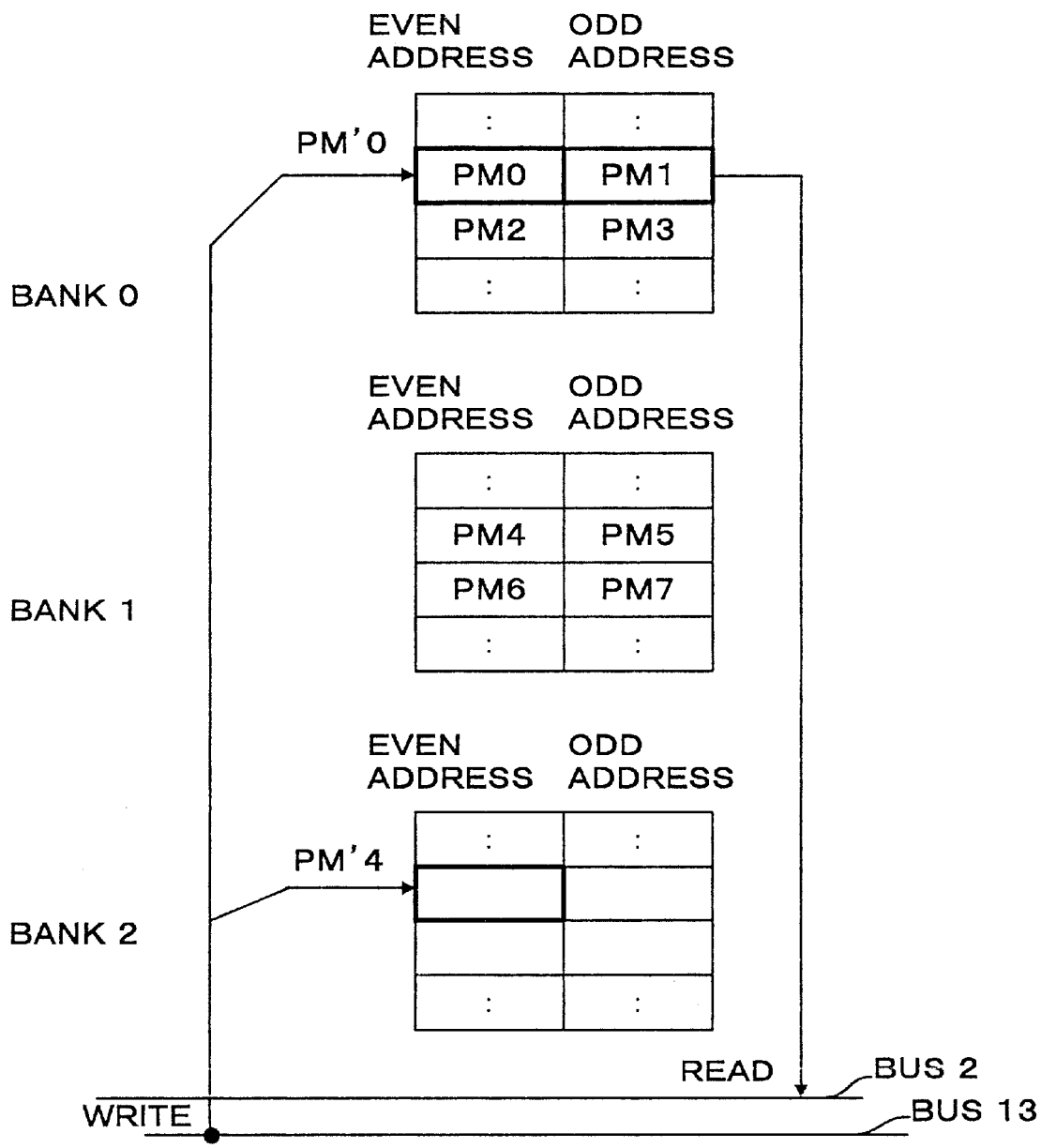
FIG. 13 is a schematic view showing an example of a memory access operation of a dual port RAM of the third embodiment of the present invention.

FIG. 13 is a schematic view showing an example of a memory access operation of the RAM 15 corresponding to FIG. 8.

In the processing unit of FIG. 12, when the ACS operation of one state is ended, only the banks 1 and 2 are switched. Then, the ACS operation of the Viterbi decoding using DSP can be executed in parallel without switching the bank 0.

In the third embodiment, the dual port RAM 15 was formed by three banks. However, the similar operation can be executed if the number of banks is more than three.

(Fourth Embodiment)

Figure 14:
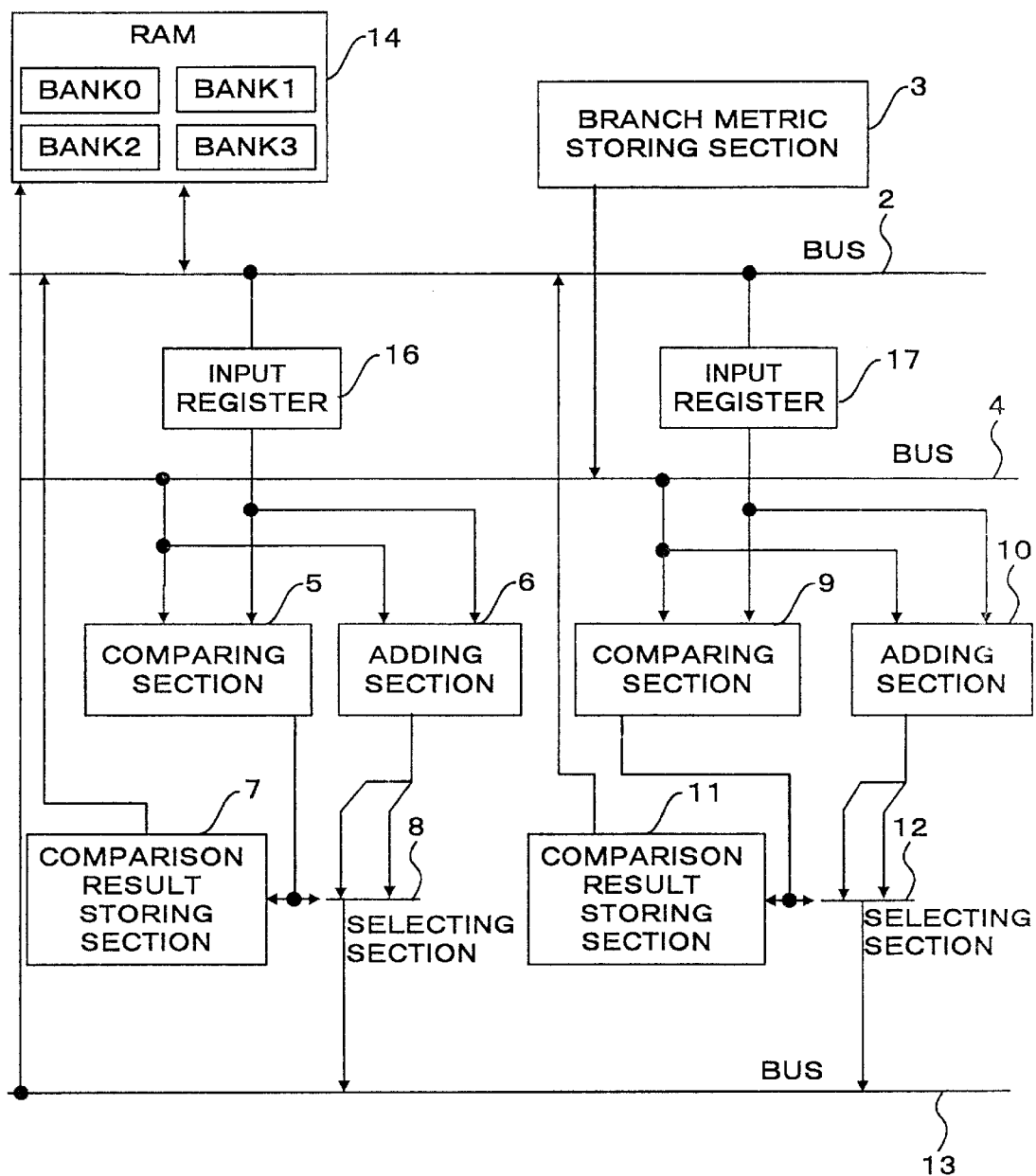
FIG. 14 is a block diagram showing the structure of the processing unit of the fourth embodiment of the present invention.

FIG. 14 is a block diagram showing the structure of the processing unit of the fourth embodiment of the present invention. In the processing unit of FIG. 14, the same reference numerals are added to the portions common to the processing unit of FIG. 6 and the explanation is omitted.

The processing unit of FIG. 14 comprises input registers 16 and 17 for inputting data from the bus 2 and for outputting data to the comparing sections 5, 9, and the adding sections 6, 10.

Figure 15:
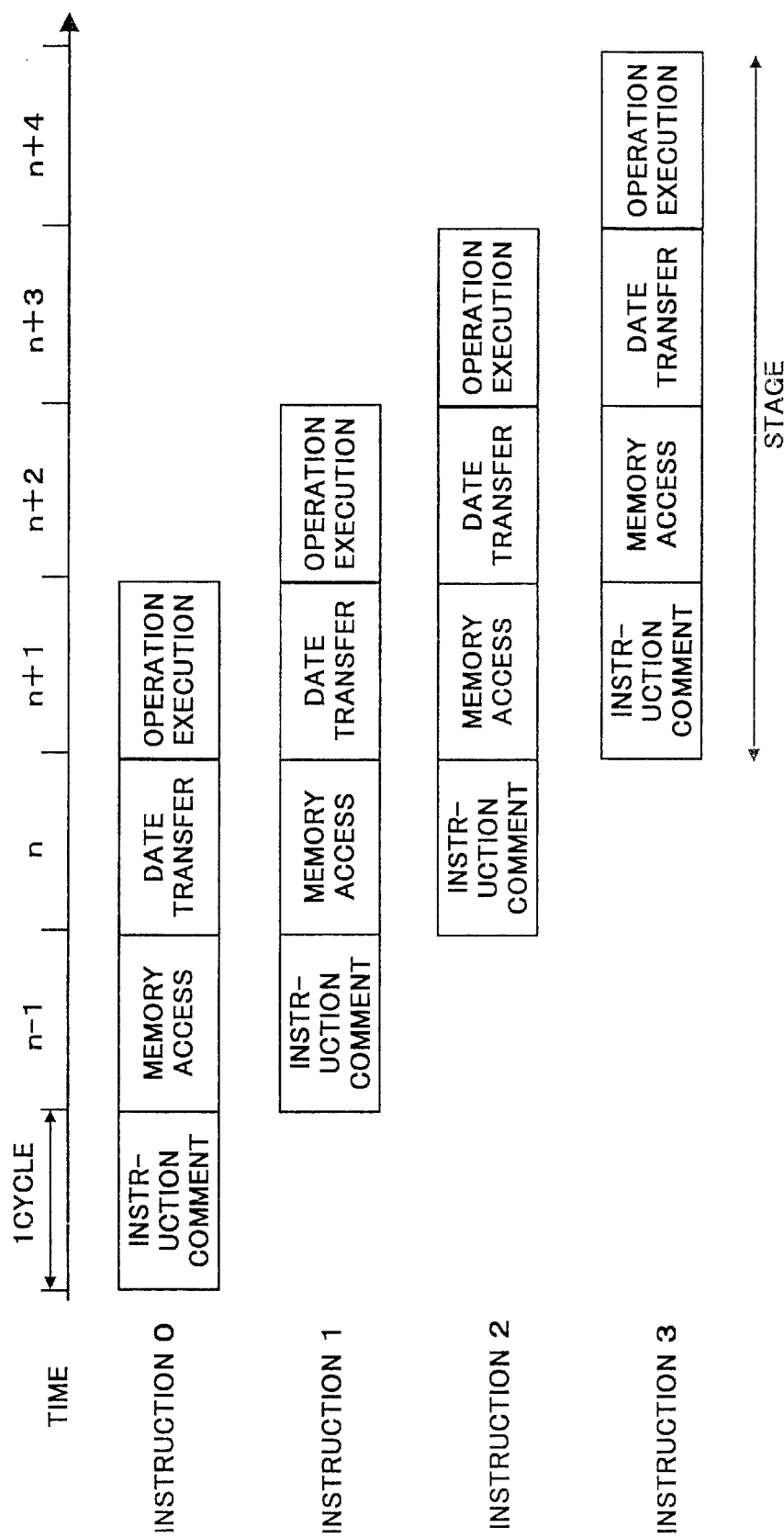
FIG. 15 is a timing view explaining a pipe line operation of the processing unit of the fourth embodiment of the present invention.

The processing unit of FIG. 14 is suitable for the operation processing of the pipe line structure shown in FIG. 15.

For example, for executing the ACS operation at an operation execution stage of n-th+2 cycle in an instruction 1, an address for reading the path metric at an memory access stage of n-th cycle is supplied to the RAM 14 in advance. Then, data output from the RAM 14 is latched to the input registers 16 and 17 via the bus 2 at a data transfer stage of n-th+1.

The pipe shown in FIG. 15 is structured so that one data transfer stage is inserted between a memory access stage and an operation execution stage of the pipe line shown in FIG. 10. In other words, data output from the RAM 14 is determined at the input registers placed at the front of the respective operation devices (comparing sections 5, 9, and adding sections 6, 10) at a starting point of the operation execution stage. As a result, time required for data transfer from the RAM 14 can be omitted.

Therefore, according to this embodiment, the ACS operation of the Viterbi decoding using DSP can be executed in parallel at relatively high speed. Note that the similar operation can be executed if the dual port RAM is used as the storing section for storing the path metrics.

(Fifth Embodiment)

Figure 16:
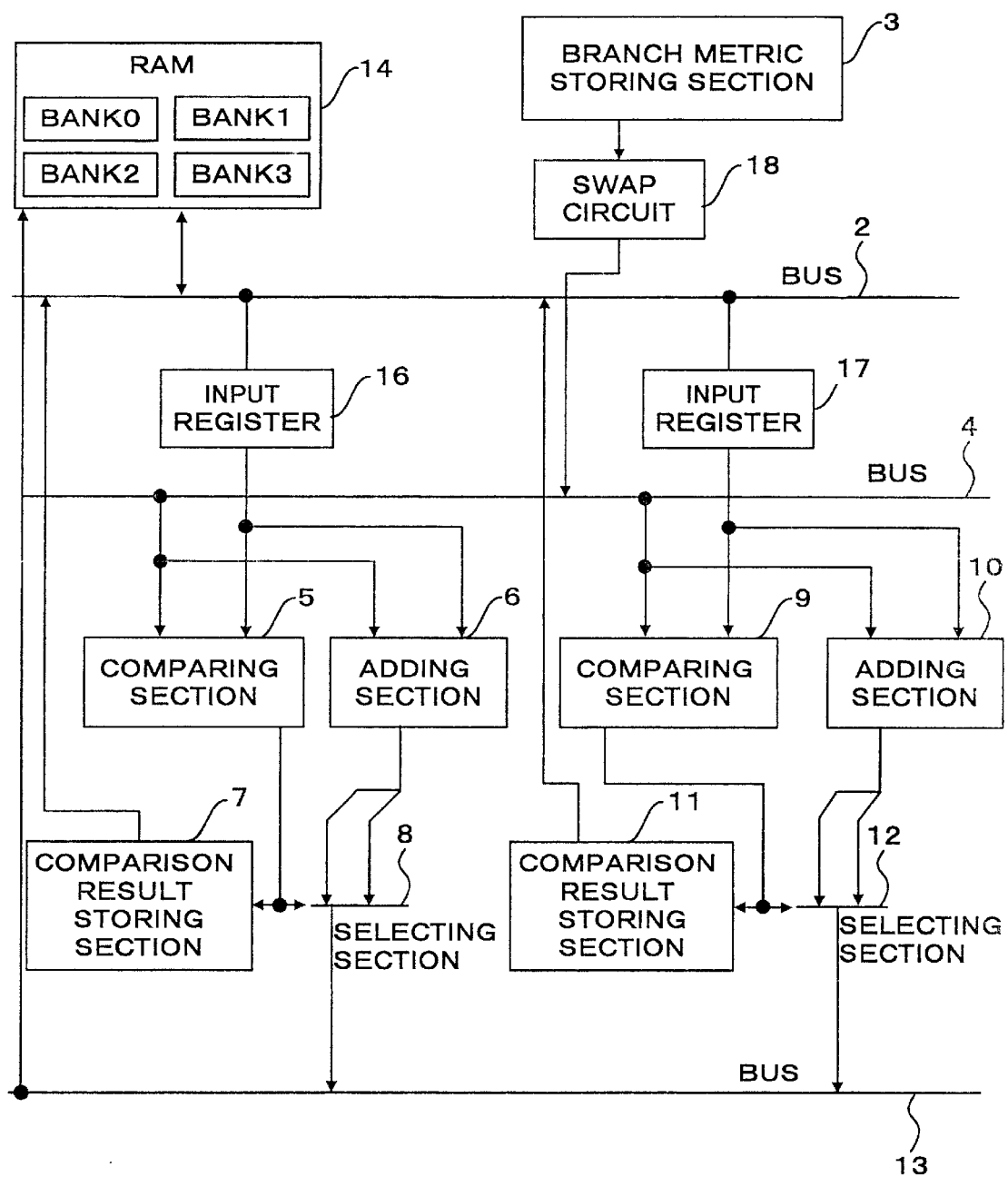
FIG. 16 is a block diagram showing the structure of the processing unit of the fifth embodiment of the present invention.

FIG. 16 is a block diagram showing the structure of the processing unit of the fifth embodiment of the present invention. In the processing unit of FIG. 16, the same reference numerals are added to the portions common to the processing unit of FIG. 14 and the explanation is omitted.

In the processing unit of FIG. 16, a swap circuit 18 is added as compared with the processing unit of FIG. 14. The swap circuit 18 directly outputs data input from the branch metric storing section 3 or swaps the high order position and the low order position so as to be output.

The processing unit of FIG. 16 is suitable for the operation processing of the pipe line structure shown in FIG. 15.

For example, let us assumed that data is input as double-precision data in a form of {BM1, BM0} from the branch metric storage 3. In this case, the swap circuit 18 has a function of switching whether values of two branch metrics are directly output as {BM1, BM0} or the high order position and the low order position are swapped so as to be output as {BM0, BM1} by an instruction.

Figure 7:
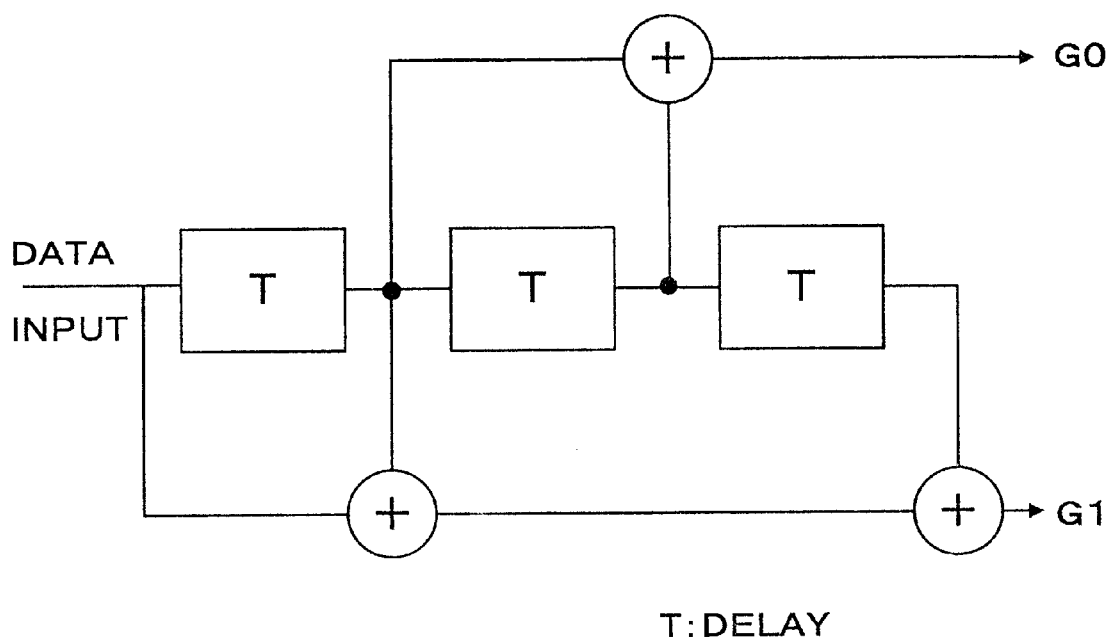
FIG. 7 is a block diagram showing an example of the convolutional encoder having a code rate ½.

The following will explain an operation of the swap circuit 18 using the convolutional encoder of FIG. 7 and the path metric transition state of the butterfly structure of FIG. 8 where the constraint length K=4 and the code rate is ½.

As shown in FIG. 17, the ACS operation, which is executed at the time of the transition from the nodes N0 and N1 of the old state to the nodes N'0 and N'4, and the ACS operation, which are executed at the time of the transition from the nodes N6 and N7 of the old state to the nodes N'3 and N'7, are compared with each other. As a result, in both ACS operations, common branch metrics BM0 and BM1 are used and the relationship in which BM0 and BM1 are swapped is established.

The ACS operation, which is executed at the time of the transition from the nodes N0 and N1 to the node N'0, and the ACS operation, which is executed at the time of the transition from the nodes N6 and N7 to the node N'3 are performed by the comparing section 5 and the adding section 6. On the other hand, the ACS operation, which is executed at the time of the transition from the nodes N3 and N1 to the node N'4, and the ACS operation, which is executed at the time of the transition from the nodes N6 and N7 to the node N'7, are performed by the comparing section 9 and the adding section 10.

For this reason, if the branch metrics are stored in the branch metric storing section 3 in both forms of {BM0, BM1} and {BM1, BM0}, the branch metric storing section 3 results in a redundant hardware source.

The swap circuit 18 is used to solve such redundancy. For example, the branch metrics are stored in the branch metric storing section 3 in only the form of {BM0, BM1}. Then, the metrics in the form of {BM0, MB1} are input to the swap circuit 18. The swap circuit 18 swaps the metrics in the form of {BM0, BM1} or the metrics in the form of {BM1, BM0} so as to be output by an instruction. Thereby, redundancy of the branch metric storing section 3 can be omitted.

The above embodiment was explained using the nodes N0, N1, N6, N7 of the old state where the constraint length K=4 and the code rate was ½. However, the aforementioned relationship can be established using even the nodes N2, N3, N4, N5. Also, the aforementioned relationship can be established using the other combinations of the constraint length K and the code rate. Therefore, the similar operation can be executed. Moreover, the similar operation can be executed even if the dual port RAM is used as the storing section for storing the path metrics.

(Sixth Embodiment)

Figure 18:
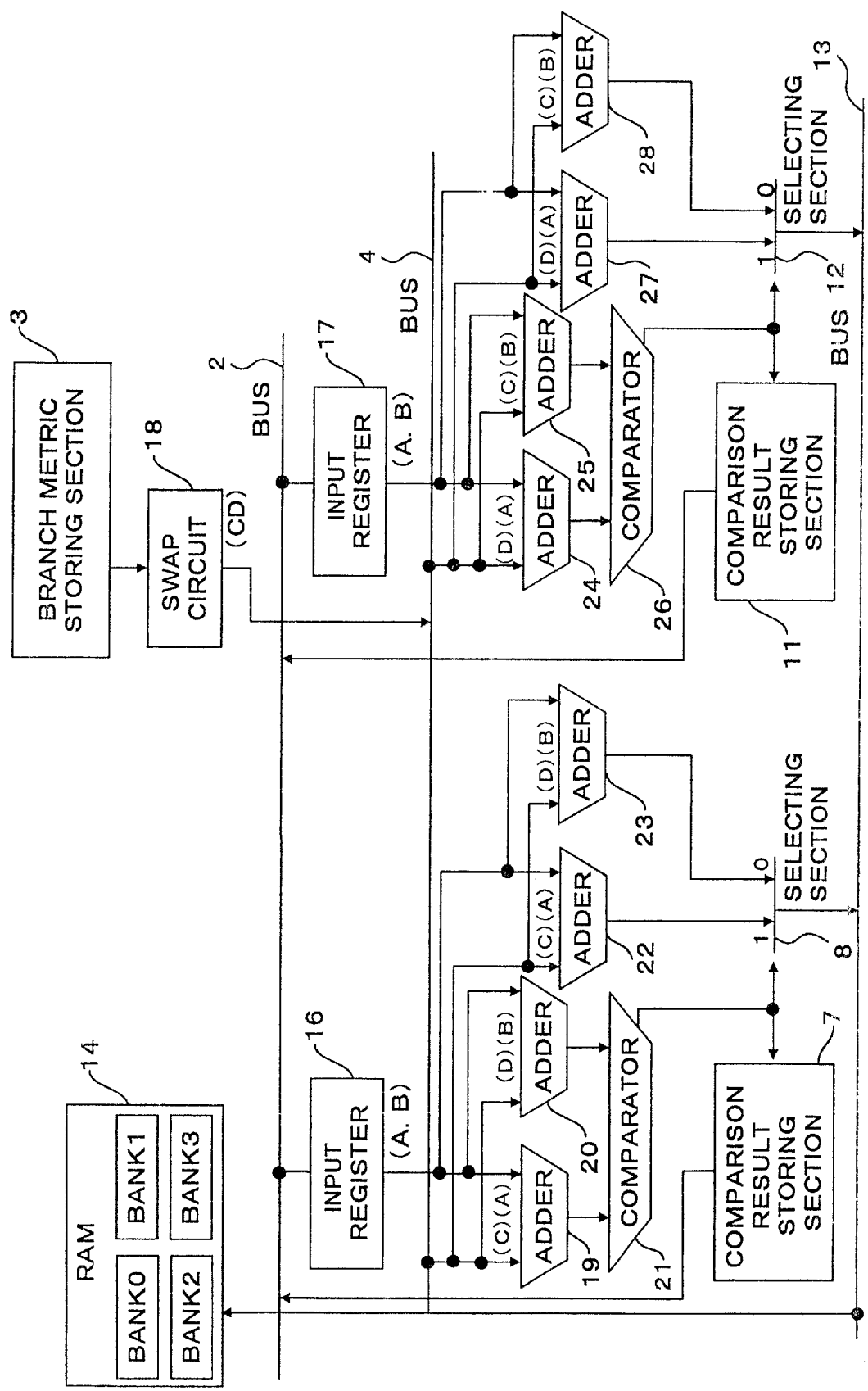
FIG. 18 is a block diagram showing the structure of the processing unit of the sixth embodiment of the present invention.

FIG. 18 is a block diagram showing the structure of the processing unit of the sixth embodiment of the present invention. In the processing unit of FIG. 18, the same reference numerals are added to the portions common to the processing unit of FIG. 16 and the explanation is omitted.

As compared with the processing unit of FIG. 16, in the processing unit of FIG. 18, the comparing section 5 comprises adders 19, 20, and a comparator 21, and the adding section 6 comprises adders 22 and 23. Also, the comparing section 9 comprises adders 24, 25, and a comparator 26, and the adding section 10 comprises adders 27 and 28.

In FIG. 18, the adders 19 and 20 input data from the bus 4 and the input register 16 and add these input data. The comparator 21 inputs addition results from the adders 19 and 20 and compares the addition results, and outputs a comparison result to the comparison result storing section 7 and the selecting section 8. The adders 22 and 23 input data from the bus 4 and the input register 16 and add these input data, and output addition results to the selecting section 8.

The adders 24 and 25 input data from the bus 4 and the input register 17 and add these input data. The comparator 26 inputs addition results from the adders 24 and 25 and compares the addition results, and outputs a comparison result to the comparison result storing section 11 and the selecting section 12. The adders 27 and 28 input data from the bus 4 and the input register 17 and add these input data, and output addition results to the selecting section The processing unit of FIG. 18 is suitable for the operation processing of the pipe line structure shown in FIG. 15.

Next, the ACS operation of the sixth embodiment will be explained. This explanation will be given using the convolutional encoder of FIG. 7 and the butterfly structure of FIG. 8 where the constraint length K=4 and the code rate is ½, and the ACS operation result of FIG. 17.

As shown in FIG. 18, two metrics are output as {A, B} from the input registers 16 and 17, and two branch metrics are output as {C, D} from the swap circuit 18. At this time, the adder 19 inputs the path metric {A} and the branch metric {C}, and outputs an addition result {A+C}. The adder 20 inputs the path metric {B} and the branch metric {D}, and outputs an addition result {B+D}. The comparator 21 inputs the addition result {A+C} of the adder 19 and the addition result {B+D} of the adder 20, compares {A+C−(B+D)}, and outputs the MSB of the comparison result. The adder 22 inputs the path metric {A} and the branch metric {C}, and outputs the addition result {A+C}. The adder 23 inputs the path metric {B} and the branch metric {D}, and outputs the addition result {B+D}.

On the other hand, the adder 24 inputs the path metric {A} and the branch metric {D}, and outputs an addition result {A+D}. The adder 25 inputs the path metric {B} and the branch metric {C}, and outputs an addition result {B+C}. The comparator 26 inputs the addition result {A+D} of the adder 24 and the addition result {B+C} of the adder 25, compares {A+D−(B+C)}, and output the MSB of the comparison result. The adder 27 inputs the path metric {A} and the branch metric {D}, and outputs the addition result {A+D}. The adder 28 inputs the path metric {B} and the branch metric {C}, and outputs the addition result {B+C}.

By the above structure and the operation, if two path metrics of the input registers 16 and 17 are set to {A,B}={PM1,PM0} and the outputs of the swap circuit 18 are set to {C,D}={BM1,BM0}, the ACS operation, which is executed at the time of the transition from the nodes N0 and N1 of the old state to the nodes N'0 and N'4, can be realized.

Also, if two path metrics of the input registers 16 and 17 are set to {A,B}={PM1,PM0} and the outputs of the swap circuit 18 are set to {C,D}={BM0,BM1}, the ACS operation, which is executed at the time of the transition from the nodes N0 and N1 of the old state to the nodes N'0 and N'4, can be realized.

Therefore, according to the sixth embodiment, the update of two path metrics can be realized at one machine cycle by the pipe line operation using DSP. The above embodiment was explained using the nodes N0, N1, N6, N7 of the old state where the constraint length K=4 and the code rate was ½. However, the aforementioned relationship can be established using even the nodes N2, N3, N4, N5. Also, the aforementioned relationship can be established using the other combinations of the constraint length K and the code rate. Therefore, the similar operation can be executed. Moreover, the similar operation can be executed even if the dual port RAM is used as the storing section for storing the path metrics.

(Seventh Embodiment)

Figure 19:
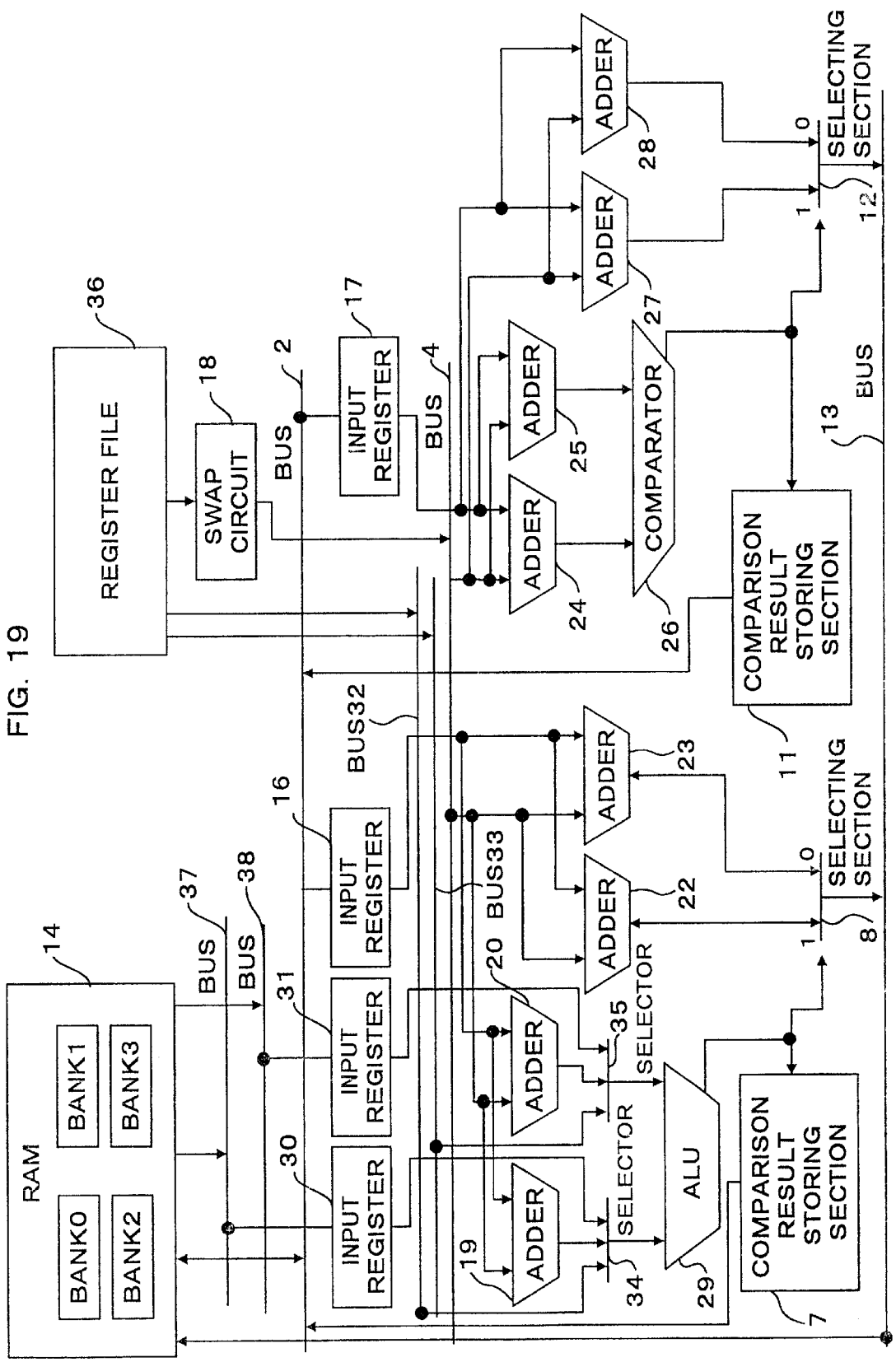
FIG. 19 is a block diagram showing the structure of the processing unit of the seventh embodiment of the present invention.

FIG. 19 is a block diagram showing the structure of the processing unit of the seventh embodiment of the present invention. In the processing unit of FIG. 19, the same reference numerals are added to the portions common to the processing unit of FIG. 18 and the explanation is omitted.

As compared with the processing unit of FIG. 18, in the processing unit of FIG. 19, an arithmetic logic section (hereinafter referred as "ALU") 29 is used in place of the comparator 21. Then, the processing unit of FIG. 19 comprises input registers 30, 31, buses 32, 33, 37, 38, and selectors 34 and 35.

In FIG. 19, the register 30 inputs data from the RAM 14 via the bus 37. The register 31 inputs data from the RAM 14 via the bus 38. The buses 32 and 33 input data from a register file 36. The selector 34 selects an output of input data from the bus 32, the adder 19, and the input register 30. The selector 35 selects an output of input data from the bus 33, the adder 20, and the input register 31. The ALU 29 inputs data from the selectors 34 and 35 and executes an arithmetic logic operation, and outputs a result of the arithmetic logic operation to the bus 13. Also, the ALU 29 outputs the MSB of the result of the arithmetic logic operation to the comparison result storing section 7 and the selecting section 8.

The processing unit of FIG. 19 is suitable for the operation processing of the pipe line structure shown in FIG. 15.

In the case where the ALU 29 performs the ACS operation, the selector 34 selects an output of the adder 19 and inputs the selected output to the ALU 29. The selector 35 selects an output of the adder 20 and inputs the selected output to the ALU 29. Then, the ALU 29 subtracts input two data, and the MSB of the subtraction result to the comparison result storing section 7 and the selecting section 8.

In the case where the ALU 29 performs the arithmetic logic operation between the register—register, the selectors 34 and 35 select the buses 32 and 33, respectively. Then, data, which is output to the buses 32 and 33 from the register file 36, is input to the ALU 29.

Also, in the case where the ALU 29 performs the arithmetic logic operation between the register-memory, the selectors 34 and 35 select the bus 32 and the input register 31, respectively. Then, data, which is output to the bus 32 from the register file 36, and data, which is output to the input register 31 from the RAM 14 via the bus 38, are input to the ALU 29.

Conversely, in the case where the ALU 29 performs the arithmetic logic operation between the memory-register, the selectors 34 and 35 select the input register 30 and the bus 33, respectively. Then, data, which is output to the register 30 from the RAM 14 via the bus 37, and data, which is output to the bus 33 from the register file 36, are input to the ALU 29.

Also, in the case where the ALU 29 performs the arithmetic logic operation between the memory memory, the selectors 34 and 35 select the input registers 30 and 31, respectively. Then, data, which is input to the input registers 30 and 31 from the RAM 14 via the buses 37 and 38, is input to the ALU 29.

Thus, according to the seventh embodiment, for implementing the processing unit in an LSI form, one of the comparators for executing the ACS operations is used as ALU. Thereby, a chip area can be decreased, and the manufacturing cost can be reduced. Note that the similar operation can be executed even if the dual port RAM is used as the storing section for storing the path metrics.

(Eighth Embodiment)

Figure 20:
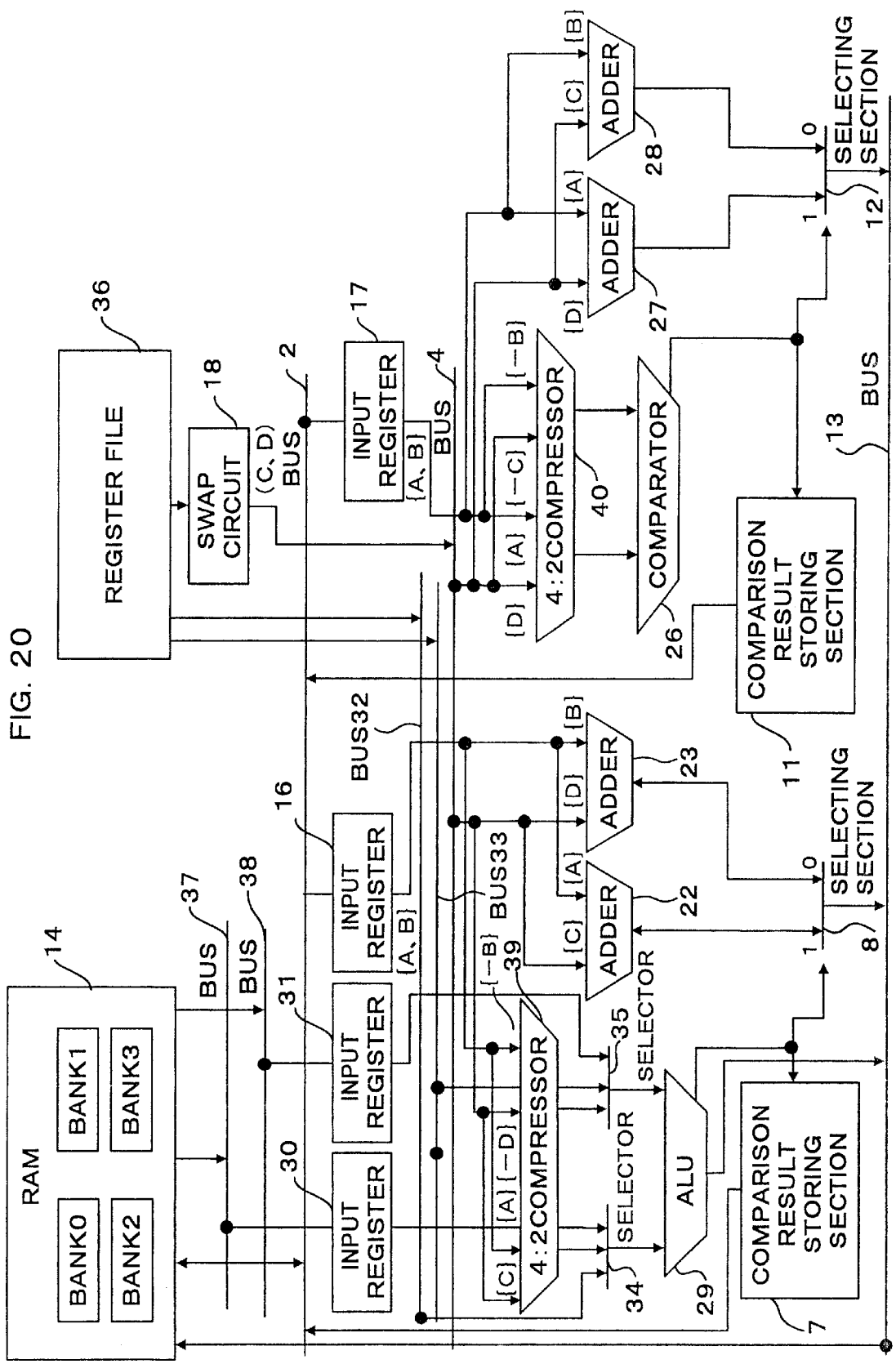
FIG. 20 is a block diagram showing the structure of the processing unit of the eighth embodiment of the present invention.

FIG. 20 is a block diagram showing the structure of the processing unit of the eighth embodiment of the present invention. In the processing unit of FIG. 20, the same reference numerals are added to the portions common to the processing unit of FIG. 19 and the explanation is omitted.

As compared with the processing unit of FIG. 19, in the processing unit of FIG. 20, two adders 19 and 20 are formed by a 4:2 compressor 39, and two adders 24 and 25 are formed by a 4:2 compressor 40. In the 4:2 compressors 39 and 40, single blocks, shown in FIG. 21, corresponding to a number of single precision bits, are connected in series. The 4:2 compressors 39 and 40 execute an addition processing at higher speed than the general full adders.

In FIG. 20, the 4:2 compressor 39 inputs data from the bus 4 and the input register 16, and outputs an operation result to the selectors 34 and 35. The 4:2 compressor 40 inputs data from the bus 4 and the input register 17, and outputs an operation result to the comparator 26.

The processing unit of FIG. 20 is suitable for the operation processing of the pipe line structure shown in FIG. 15.

Next, the ACS operation of the eighth embodiment will be explained. This explanation will be given using the convolutional encoder of FIG. 7 and the butterfly structure of FIG. 8 where the constraint length K=4 and the code rate is ½, and the ACS operation result of FIG. 17.

First of all, two metrics are output as {A, B} from the input registers 16 and 17, and two branch metrics are output as {C, D} from the swap circuit 18.

Then, the 4:2 compressor 39 inputs the path metric {A} and the branch metric {C}, a reverse {⁻B} for path metric {B}, and a reverse {⁻D} for branch metric D, and outputs {A+C} and {B+D}. Two outputs {A+C} and {B+D} of the 4:2 compressor 39 are input to the ALU 29 via the selectors 34 and 35 so as to be added. In this case, to realize two complements {B} and {D}, "1" is input to the 4:2 compressor 39 and the least significant carry input of the ALU 29. As a result, {A+C−(B+D)} is obtained and the MSB is output from the ALU 29.

Also, the adder 22 inputs the path metric {A} and the branch metric {C}, and outputs the addition result {A+C}. Similarly, the adder 23 inputs the path metric {B} and the branch metric {D}, and outputs the addition result {B+D}.

On the other hand, the 4:2 compressor 40 inputs the path metric {A} and the branch metric {D}, a reverse {⁻B} for path metric {B}, and a reverse {⁻C} for branch metric C, and outputs {A+C} and {B+D}. Two outputs {A+C} and {B+D} of the 4:2 compressor 40 are input to the comparator 26 so as to be added. In this case, to realize two complements {B} and {C}, "1" is input to the 4:2 compressor 40 and the least significant carry input of the comparator 26. As a result, {A+D−(B+C)} is obtained and the MSB is output from the comparator 26.

Also, the adder 27 inputs the path metric {A} and the branch metric {D}, and outputs the addition result {A+D}. Similarly, the adder 28 inputs the path metric {B} and the branch metric {C}, and outputs the addition result {B+C}.

By the above structure and the operation, if two path metrics {A,B} of the input registers 16 and 17 are set to {PM1,PM0} and the outputs {C,D} of the swap circuit 18 are set to {BM1,BM0}, the ACS operation, which is executed at the time of the transition from the nodes N0 and N1 of the old state of FIG. 17 to the nodes N'0 and N'4, can be realized.

Also, if two path metrics {A,B} of the input registers 16 and 17 are set to {PM1,PM0} and the outputs {C,D} of the swap circuit 18 are set to {BM0,BM1}, the ACS operation, which is executed at the time of the transition from the nodes N0 and N1 of the old state of FIG. 17 to the nodes N'0 and N'4, can be realized. Therefore, the update of two path metrics can be realized at one machine cycle by the pipe line operation using DSP.

Thus, according to the eighth embodiment, the use of the 4:2 compressors as the comparing section for executing the ACS operation can realize the higher speed computation than the case using two adders. The above embodiment was explained using the nodes N0, N1, N6, N7 of the old state where the constraint length K=4 and the code rate was ½. However, the aforementioned relationship can be established using even the nodes N2, N3, N4, N5. Also, the aforementioned relationship can be established using the other combinations of the constraint length K and the code rate. Therefore, the similar operation can be executed. Moreover, the similar operation can be executed even if the dual port RAM is used as the storing section for storing the path metrics.

(Ninth Embodiment)

Figure 22:
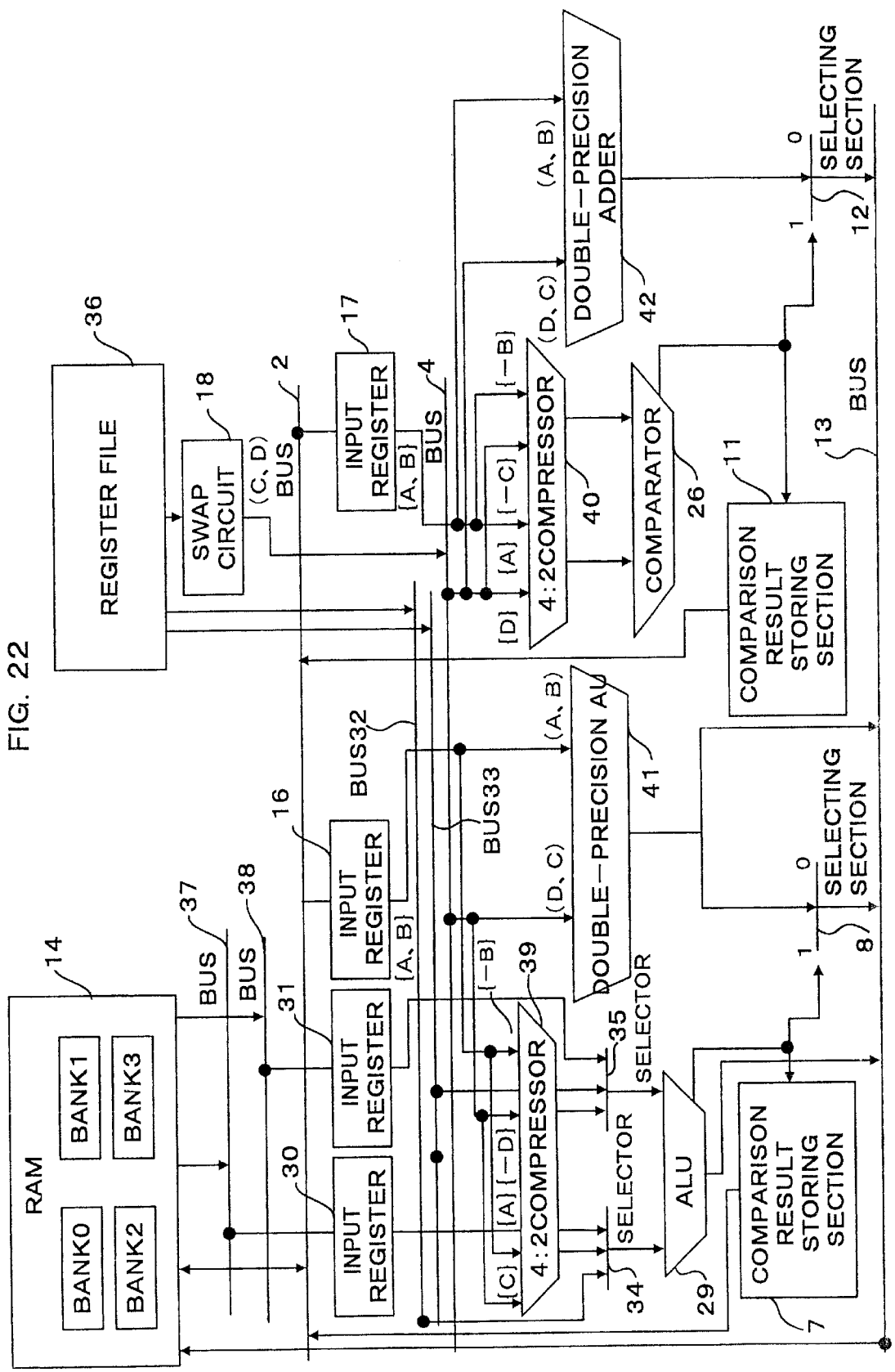
FIG. 22 is a block diagram showing the structure of the processing unit of the ninth embodiment of the present invention.

FIG. 22 is a block diagram showing the structure of the processing unit of the seventh embodiment of the present invention. In the processing unit of FIG. 22, the same reference numerals are added to the portions common to the processing unit of FIG. 20 and the explanation is omitted.

As compared with the processing unit of FIG. 20, in the processing unit of FIG. 22, double-precision adders 41 and 42 are used as adding sections, and at least one of the adders uses a double-precision AU 41.

In FIG. 22, the double-precision AU 41 inputs data in a double-precision form from the input register 16 and the bus 4 and executes a double-precision arithmetic operation. The double-precision adder 42 inputs data in a double-precision form from the input register 17 and the bus 4 and executes a double-precision adding operation. The double-precision AU 41 outputs an operation result to the selecting section 8 and the bus 13, and the output of the double-precision adder 42 is output to the selecting section 12.

The processing unit of FIG. 22 is suitable for the operation processing of the pipe line structure shown in FIG. 15.

Figure 23:
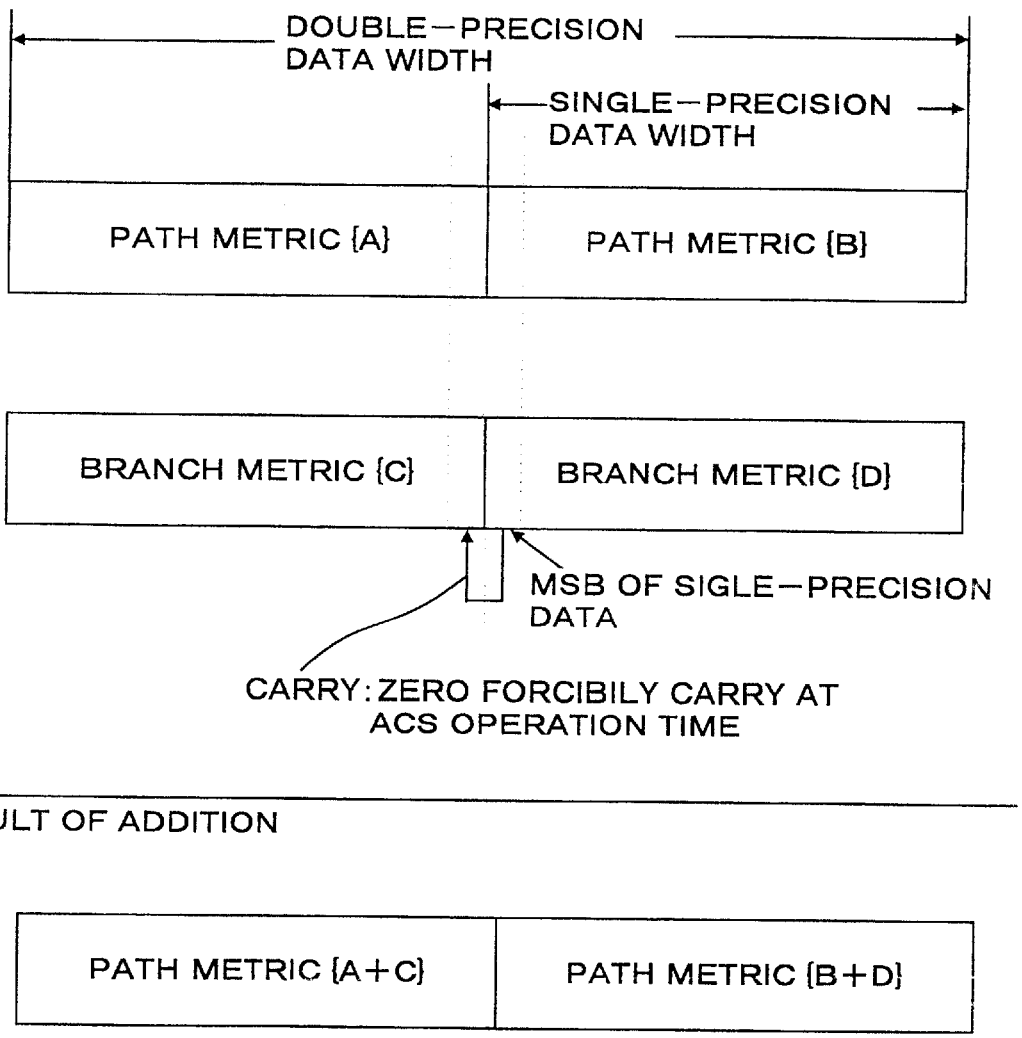
FIG. 23 is a view showing a carry control of a double-precision AU.

For executing the ACS operation in the ninth embodiment, the double-precision AU 41 inputs two path metrics as {A, B} in a double-precision form from the input register 16. Then, the double-precision AU 41 inputs two branch metrics as {C, D} in a double-precision form from the swap circuit 18 via the bus 4, and executes a double-precision addition. At this time, the double-precision AU 41, as shown in FIG. 23, forcibly zeros the carry from the bit position of the single-precision MSB to a next stage, and executes two additions of the path metrics and the branch metrics, {A+C, B+D}, simultaneously.

On the other hand, the double-precision adder 42 inputs two path metrics as {A, B} in a double-precision form from the input register 17. Then, the double-precision adder 42 inputs two branch metrics as {D, C} in a double-precision form from the swap circuit 18 via the bus 4. Then, the double-precision adder 42 forcibly zeros the carry from the bit position of the single-precision MSB to a next stage, and executes two additions of the path metrics and the branch metrics, {A+C, B+D}, simultaneously.

Thus, according to the ninth embodiment, the double-precision AU 41 is used as the adding section for executing the ACS operation. At the time of the ACS operation, the double-precision AU 41 forcibly zeros the carry from the bit position of the single-precision MSB to the next stage. At the time of the double-precision arithmetic operation other than the ACS operation, the control for propagating the carry is added. Thereby, for example, the double-precision AU 41 can be used as a double-precision accumulation adder at the time of product and addition operations. Therefore, in the case of implementing the processing unit in an LSI form, the chip area can be further decreased, and the manufacturing cost can be reduced. Note that the similar operation can be executed even if the dual port RAM is used as the storing section for storing the path metrics.

(Tenth Embodiment)

Figure 24:
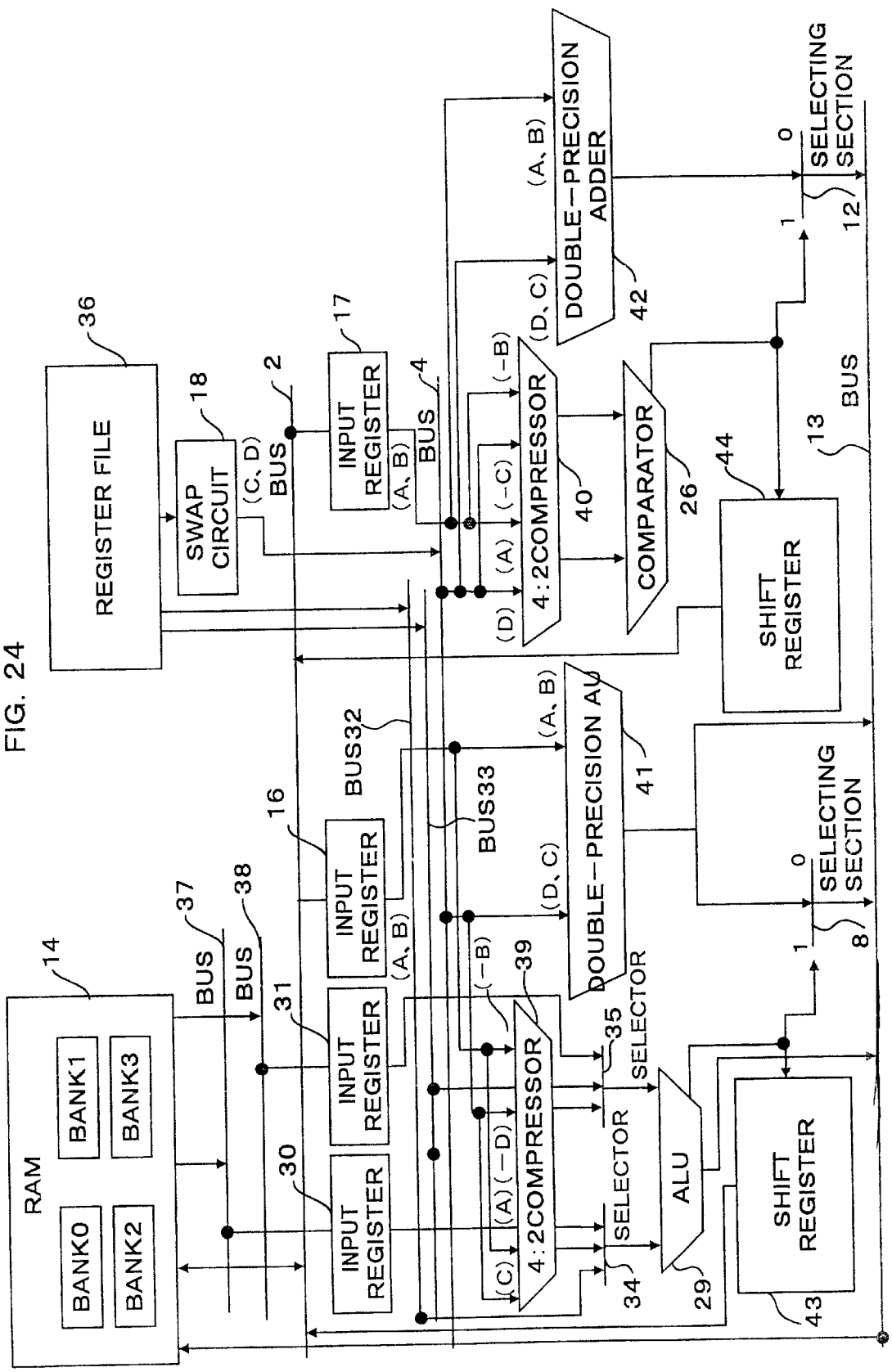
FIG. 24 is a block diagram showing the structure of the processing unit of the tenth embodiment of the present invention.

FIG. 24 is a block diagram showing the structure of the processing unit of the tenth embodiment of the present invention. In the processing unit of FIG. 24, the same reference numerals are added to the portions common to the processing unit of FIG. 22 and the explanation is omitted.

As compared with the processing unit of FIG. 22, in the processing unit of FIG. 20, shift registers 43 and 44 are used as a comparison result storing section.

In FIG. 24, the shift register 43 inputs the MSB of the operation result of the ALU 29 so as to be output to the bus 2. The shift register 44 inputs the MSB of the operation result of the comparator 26 so as to be output to the bus 2.

The processing unit of FIG. 24 is suitable for the operation processing of the pipe line structure shown in FIG. 15.

For executing the ACS operation in the tenth embodiment, the BSM of the comparison result of the ALU 29 is shifted in the shift register 43 at any time. The BSM of the comparison result of the comparator 26 is shifted in the shift register 44 at any time. Thereby, a path select signal can be stored in the RAM 14. In this case, the path select signal shows which path of two paths has been selected, and is used in executing the trace-back after the end of the ACS operation.

For example, in a case where the bit width of the shift register 43 and that of the shift register 44 are single-precision data widths, the path select signal can be stored when the ACS operation corresponding to a number of single-precision bits are executed.

Thus, according to the tenth embodiment, the shift registers are used as storing means for executing the ACS operations and for storing the comparison result. Thereby, for example, the shift registers can be used as an operation instruction for using a shift register of a division system. Therefore, in the case of implementing the processing unit in an LSI form, the chip area can be further decreased, and the manufacturing cost can be reduced. Note that the similar operation can be executed even if the dual port RAM is used as the storing section for storing the path metrics.

(Eleventh Embodiment)

Figure 25:
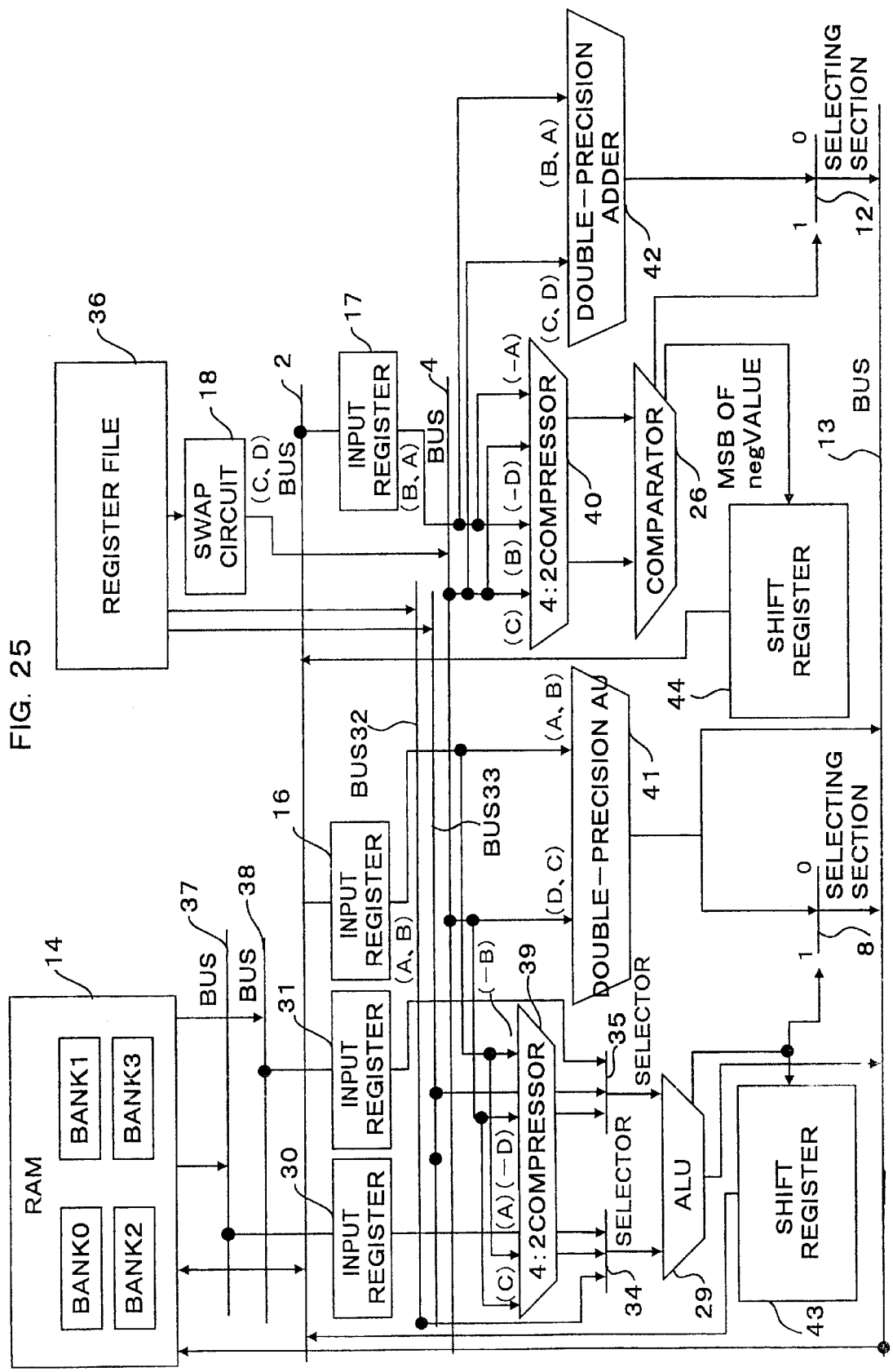
FIG. 25 is a block diagram showing the structure of the processing unit of the eleventh embodiment of the present invention.

FIG. 25 is a block diagram showing the structure of the processing unit of the eleventh embodiment of the present invention. In the processing unit of FIG. 25, the same reference numerals are added to the portions common to the processing unit of FIG. 24 and the explanation is omitted.

As compared with the processing unit of FIG. 24, in the processing unit of FIG. 25, the input register 17 swaps the path metric data so as to be input from the bus 2. Then, 4:2 compressor 40 directly inputs the branch metric data without swapping the branch metric data, and a negate value of the comparison result of the comparator 26 is shifted in the shift register 44.

The processing unit of FIG. 25 is suitable for the operation processing of the pipe line structure shown in FIG. 15.

For executing the ACS operation in this embodiment, two path metrics {A,B} are directly input to the input register 16 as {A,B}, and input to the input register 17 as {B,A} in a swapped state. After that, two branch metrics are input from the swap circuit 18 to the 4:2 compressor 40 as {C} and {⁻D}, and two path metrics are input from the input register 17 to the 4:2 compressor 40 as {B} and {⁻A}, and {A+B} and {B+C} are output.

Then, the comparator 26 inputs two outputs {A+B} and {B+C} so as to calculate {A+D−B−C}.

On the other hand, the double-precision adder 42 inputs two branch metrics as {C, D} from the swap circuit 18, and inputs two path metrics as {B, A} from the input register.

Then, {B+C} and {A+D} are simultaneously computed in parallel, and output to the selecting section 12 in the form of {B+C, A+D}.

Then, the MSB of the comparison result is output to the selecting section 12 from the comparator 26, and the MSB of the negate value of the comparison result is output to the shift register 44.

Thus, according to the eleventh embodiment, one of the input registers for storing two path metrics swaps data to be input. As a result, since the need of the swapping operation at the input of the 4:2 compressor 40 and that of the double-precision adder 42 can be eliminated at the operation execution (EX) stage, the ACS operation can be executed at higher speed. Note that the similar operation can be executed even if the dual port RMA is used as the means for storing the path metrics.

(Twelfth Embodiment)

Figure 26:
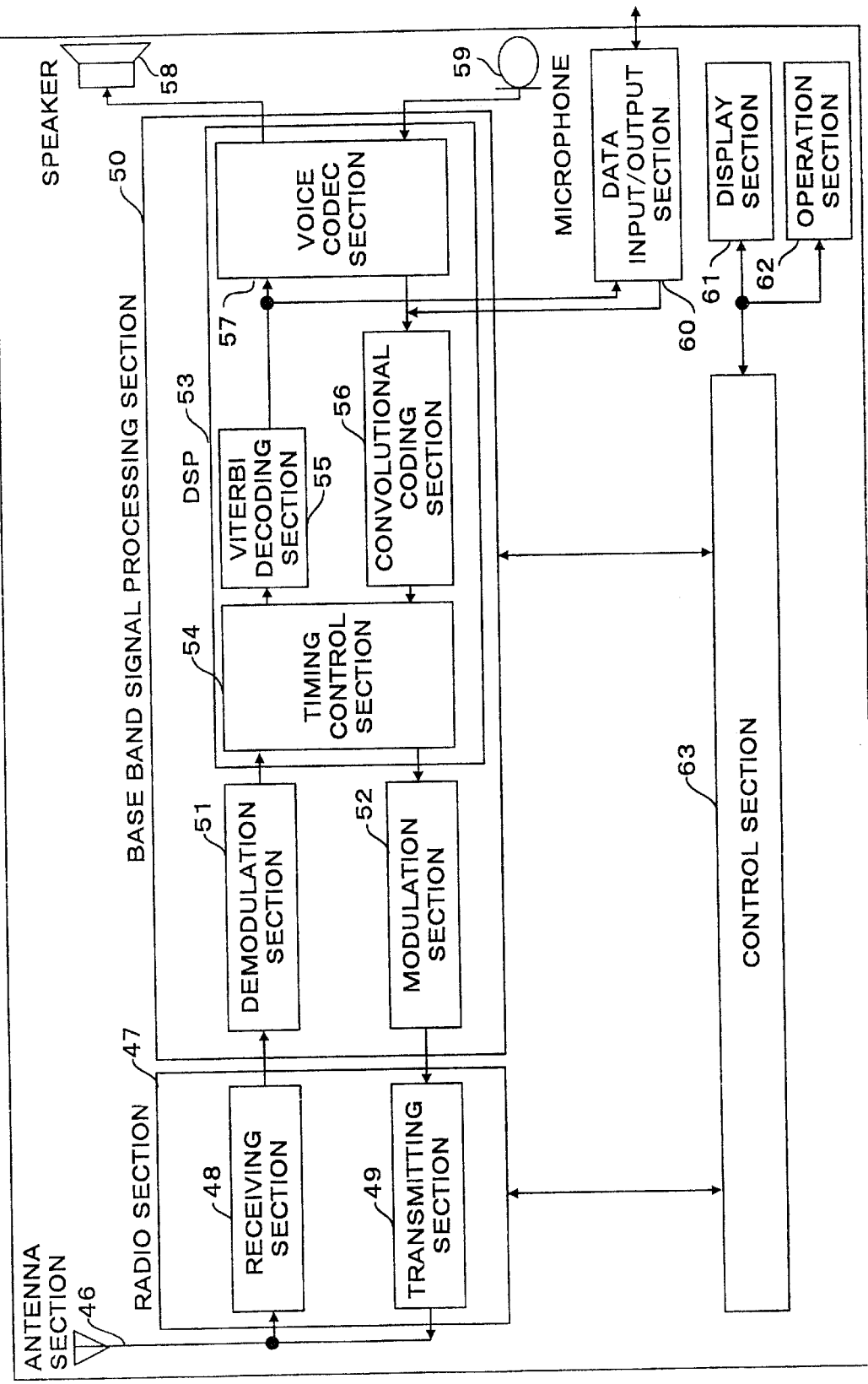
FIG. 26 is block diagram showing the structure of a mobile station apparatus of the twelfth embodiment of the present invention.

FIG. 26 is a block diagram showing the structure of a mobile station apparatus in the twelfth embodiment. A mobile station apparatus 45 shown in FIG. 26 comprises an antenna section 46 for both reception and transmission, a radio section 47 having a receiving section 48 and a transmitting section 49, a base band signal processing section 50 for executing a signal modulation and demodulation, and a signal coding and decoding, a speaker 58 for outputting a sound, a microphone 59 for inputting a sound, a data input/output section 60 for inputting/outputting data to be received and transmitted from/to an outer device, a display section 61 for displaying an operation state, an operation section 62 such as a 10-button keypad, and a control section 63 for controlling the respective parts.

The base band signal processing section 50 comprises a demodulation section 51 for demodulating a received signal, a modulation section 52 for modulating a transmitted signal, and a DSP 53 of one chip.

The DSP 53 comprises a Viterbi decoding section 55, which is formed by any one of the processing units of the first to eleventh embodiments, a convolutional coding section 56 for convolutional coding the transmitted signal, a voice codec section 57 for executing a voice signal coding and decoding, and a timing control section 54 for controlling timing for sending the received signal to the Viterbi decoding section 55 from the demodulation section 51 and timing for sending the transmitted signal to the modulation section 52 from the convolutional coding section 56. These devices are formed by software, respectively.

The control section 63 displays a signal input from the operation section 62 to the display section 61, receives the signal input from the operation section 62. Then, the control section 63 outputs a control signal for performing a calling operation to the antenna section 46, the radio section 47, and the base band signal processing section 50 in accordance with a communication sequence.

If the voice is transmitted from the mobile station apparatus 45, the voice signal input from the microphone 59 is AD converted by an AD converter (not shown). Then, the converted signal is coded by the voice codec section 57 so as to be input to the convolutional coding section 56. If data is transmitted, data input from the outer section is input to the convolutional coding section 56 through the data input/output section 60.

Data input to the convolutional coding section 56 is convolutional coded, and the timing control section 54 sorts data and adjusts the transmission output timing so as to output data to the modulation section 52. Data input to the modulation section 52 is digitally modulated, AD converted, and output to the transmitting section 49 of the radio section 47. Data input to the transmitting section 49 is converted to radio signals, and output to the antenna section 46 as radio waves.

On the other hand, for outputting data received by the mobile station apparatus 45, the radio waves received by the antenna portion 46 are received by the receiving section 48 of the radio potion 47, AD converted, and output to the demodulation section 51 of the base band signal processing section 50. Data demodulated by the demodulation section 51 is sorted by the timing control section 54, thereafter being decoded by the Viterbi decoding section 55.

In the case of voice communications, decoded data is voice decoded by the voice codec section 57, and is DA converted, thereafter being output to the speaker 58 as a voice. In the case of data communications, data decoded by the Viterbi decoding section 55 is output to the outer section through the data input/output section 60.

In the mobile station apparatus 45 of the twelfth embodiment, the respective parts of the Viterbi decoding section 55, the convolutional coding section 56, the voice codec section 57, and the timing control section 54 are formed by software of one chip DSP 53. Thus, the mobile station apparatus 45 can be assembled by a small number of parts. Also, since the Viterbi decoding section 55 is formed by any one of the processing units of the first to eleventh embodiments, the update of two path metrics can be realized with one machine cycle in the pipe line processing using DSP 53. Thereby, the high speed ACS operation of the Viterbi decoding using DSP 53 can be realized with relative a small amount of processing.

In this embodiment, the demodulation section 51 and the modulation section 52 are shown to be differentiated from DSP 53. However, these devices can be formed by software of DSP 53. Also, the DSP of the sixth embodiment can be used as DSP 53, and the convolutional coding section 56, the voice codec section 57, and the timing control section 54 can be formed by the other parts, respectively.

(Thirteenth Embodiment)

Figure 27:
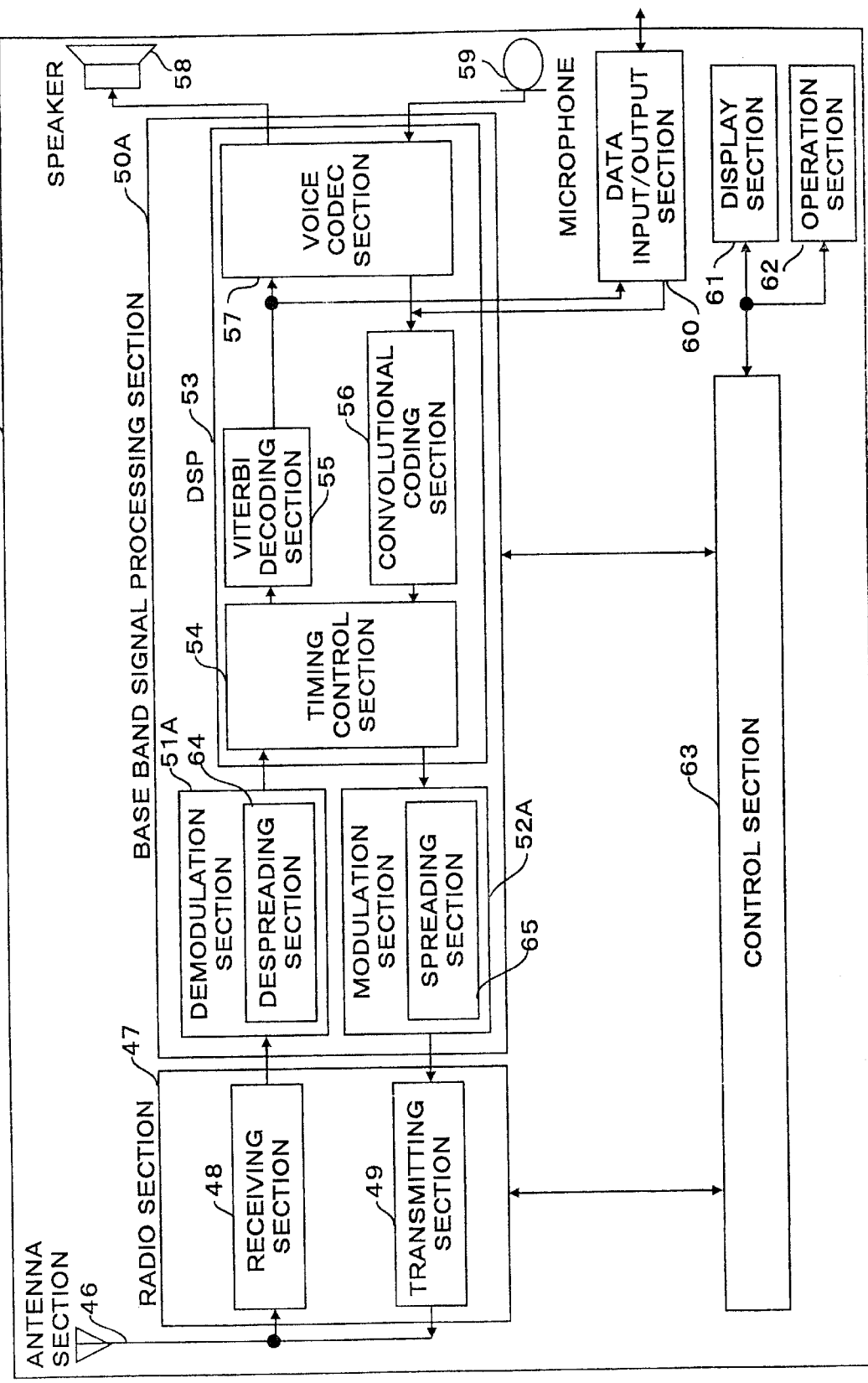
FIG. 27 is a block diagram showing the structure of the mobile station apparatus of the thirteenth embodiment of the present invention.

FIG. 27 is a block diagram showing the structure of a mobile station apparatus in the thirteenth embodiment. In a mobile station apparatus 45A of FIG. 27, the same reference numerals are added to the portions common to the portions of the mobile station apparatus 45 of FIG. 26, and the explanation is omitted.

As compared with the mobile station apparatus 45 of FIG. 26, in the mobile station apparatus 45A of FIG. 27, a spreading section 65 is provided in a modulation section 52A, and a despreading section 64 is provided in a demodulation section 51A, so that a base band signal processing section 50A of a CDMA communication system is formed. In the case of the CDMA communication system, in some cases, a RAKE receiving section, in which a plurality of fingers selected from a delay profile are adjusted to each other, is included in the timing control section 54.

Thus, in the mobile station apparatus 45A in the thirteenth embodiment, the despreading section 64 is provided in the demodulation section 51A and the spreading section 65 is provided in the modulation section 52A. Thereby, the mobile station apparatus 45A of the thirteenth embodiment can be applied to the CDMA communication system.

(Fourteenth Embodiment)

Figure 28:
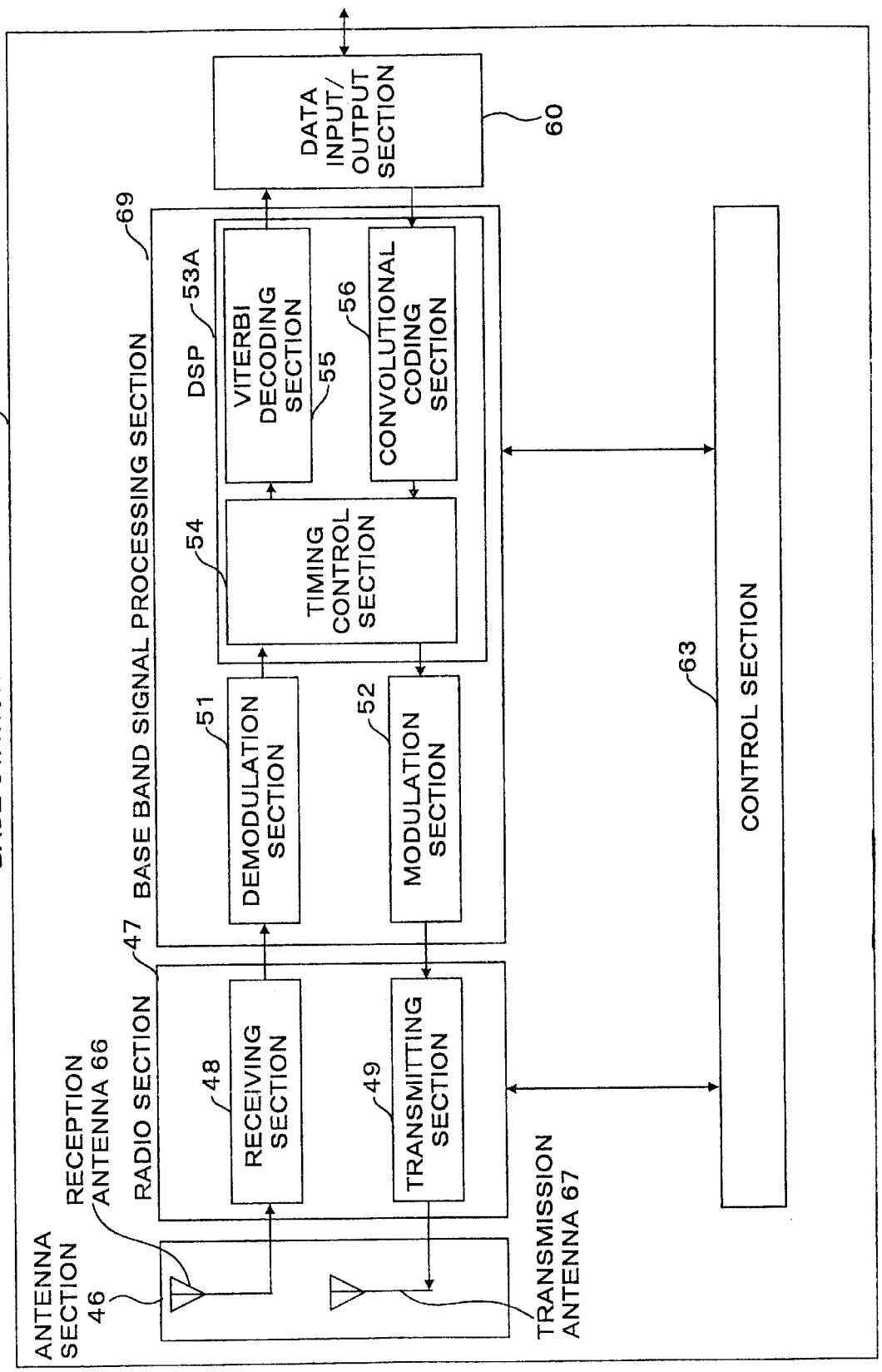
FIG. 28 a block diagram showing the structure of a base station apparatus of the fourteenth embodiment of the present invention.

FIG. 28 is a block diagram showing the structure of a base station apparatus in the fourteenth embodiment.

In FIG. 28, a base station apparatus 68 of the fourteenth embodiment comprises the antenna section 46 having an antenna 66 for receiving and an antenna 67 for transmitting, the radio section 47 having the receiving section 48 and the transmitting section 49, a base band signal processing section 69 for executing a signal modulation and demodulation and a signal coding and decoding, the data input/output section 60 for inputting/outputting data to be received and transmitted from/to a cable network, and the control section 63 for controlling the respective parts.

The base band signal processing section 69 comprises the demodulation section 51 for demodulating the received signal, the modulation section 52 for modulating the transmitted signal, and one chip DSP 53A. The DSP 53A comprises the Viterbi decoding section 55, which is formed by any one of the processing units of the first to eleventh embodiments, the convolutional coding section 56 for convolutional coding the transmitted signal, and the timing control section 54 for controlling timing for sending the received signal to the Viterbi decoding section 55 from the demodulation section 51 and timing for sending the transmitted signal to the modulation section 52 from the convolutional coding section 56. These devices are formed by software, respectively.

When data is received to the base station apparatus 68 from the cable network, data is input to the convolutional coding section 56 through the data input/output section 60. Then, data input to the convolutional coding section 56 is convolutional coded, and the timing control section 54 sorts input data and adjusts the transmission output timing so as to output data to the modulation section 52. Data input to the modulation section 52 is digitally modulated, AD converted, and is converted to radio signals by the transmitting section 49. Then, the radio signals are transmitted from the antenna section 46 as radio waves.

On the other hand, if data is received to the base station apparatus 68 from the radio network, the radio waves received by the antenna portion 46 are AD converted by the receiving section 48 and demodulated by the demodulation section 51 of the base band signal processing section 69. Demodulated data is sorted by the timing control section 54, and decoded by the Viterbi decoding section 55, thereafter being output to the cable network via the data input/output section 60.

In the base station apparatus 68 of the fourteenth embodiment, the respective parts of the Viterbi decoding section 55, the convolutional coding section 56, and the timing control section 54 are formed by software of one chip DSP 53A. Thus, the base station apparatus 68 can be assembled by a small number of parts. Also, since the Viterbi decoding section 55 is formed by any one of the processing units of the first to eleventh embodiments, the update of two path metrics can be realized with one machine cycle in the pipe line processing using DSP 53A. Thereby, the high speed ACS operation of the Viterbi decoding using DSP 53A can be realized with relatively a small amount of processing.

In this embodiment, the demodulation section 51 and the modulation section 52 are shown to be differentiated from DSP 53A. However, these devices can be formed by software of DSP 53A. Also, the DSP of the sixth embodiment can be used as DSP 53A, and the convolutional coding section 56, the voice codec section 57, and the timing control section 54 can be formed by the other parts, respectively.

(Fifteenth Embodiment)

Figure 29:
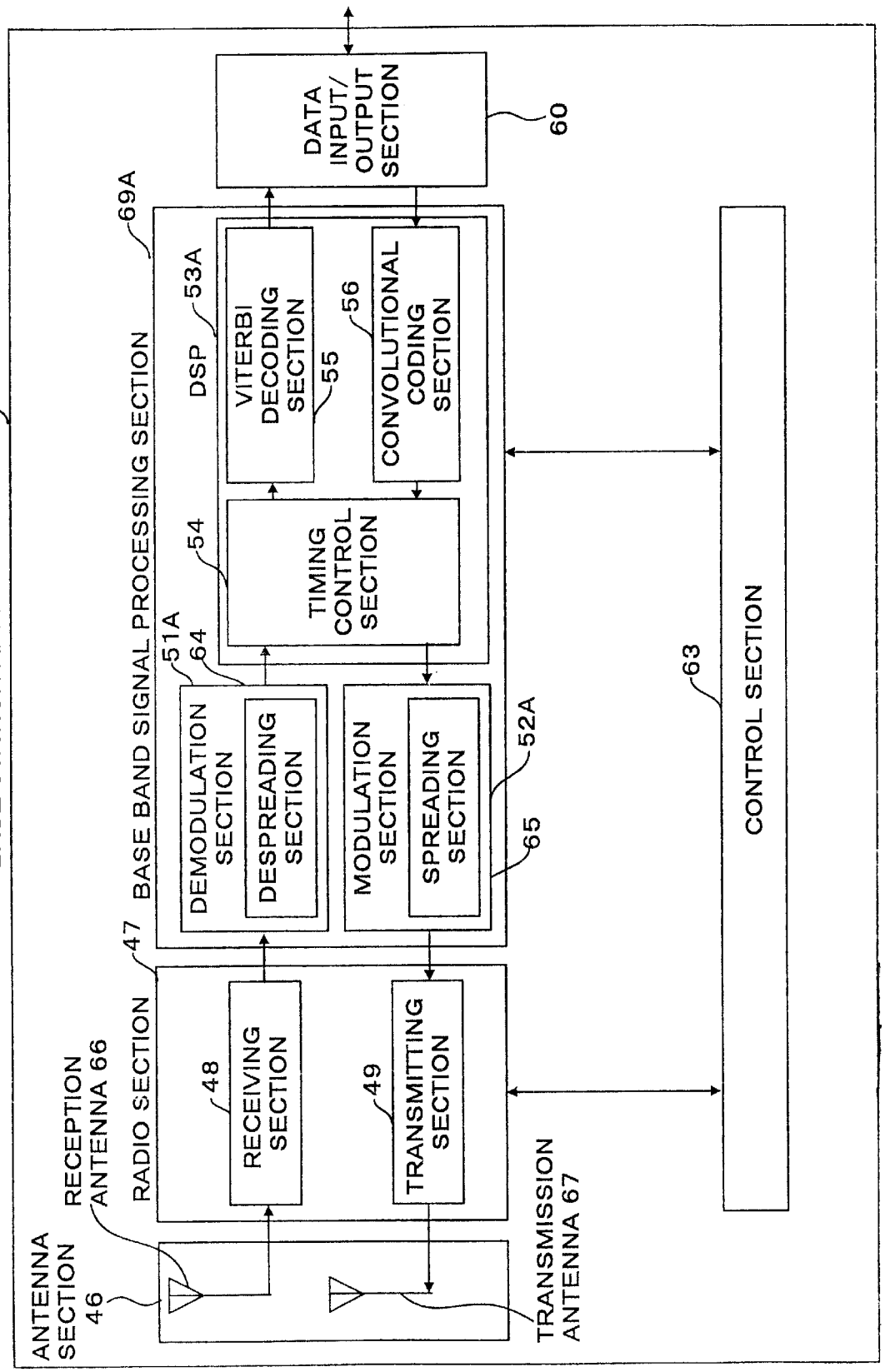
FIG. 29 a block diagram showing the structure of the base station apparatus of the fifteenth embodiment of the present invention.

FIG. 29 is a block diagram showing the structure of a base station apparatus in the fifteenth embodiment. In a base station apparatus 68A of FIG. 29, the same reference numerals are added to the portions common to the portions of the base station apparatus 68 of FIG. 28, and the explanation is omitted.

As compared with the mobile station apparatus 45 of FIG. 26, in the mobile station apparatus 45A of FIG. 27, the spreading section 65 is provided in the modulation section 52A, and the despreading section 64 is provided in the demodulation section 51A, so that the base band signal processing section 50A of the CDMA communication system is formed. In the case of the CDMA communication system, in some cases, the RAKE receiving section, in which the plurality of fingers selected from the delay profile are adjusted to each other, is included in the timing control section 54.

Thus, in the base station apparatus 68A of the fifteenth embodiment, the despreading section 64 is provided in the demodulation section 51A and the spreading section 65 is provided in the modulation section 52A. Thereby, the base station apparatus 68A of the fifteenth embodiment can be applied to the CDMA communication system.

As mentioned above, the update of two path metrics can be realized with one machine cycle in the pipe line processing using DSP. Thereby, the high speed ACS operation of the Viterbi decoding using DSP can be realized with relative a small amount of processing. This makes it possible to downsize the portable terminal, reducing the weight, lowering the cost, and increasing the life of a battery.

What is claimed is:

1. A digital signal processor comprising:
    an arithmetic logic unit configured to perform a register—register arithmetic logic operation,
    wherein the arithmetic logic unit is used to determine a first minimum data of a first data and a second data, in parallel with a determination of a second minimum data of a third data and a fourth data.

2. The digital signal processor according to claim 1, wherein the digital signal processor provides the first minimum data as a high part of a processing data and provides the second minimum data as a low part of the processing data 3. The digital signal processor according to claim 2, wherein the digital signal processor provides the first data if the first data is equal to the second data, and provides the third data if the third data is equal to the fourth data.

4. The digital signal processor according to claim 3, further comprising:
    an instruction fetching unit that fetches instructions;
    a decoding unit that decodes the instructions fetched by the instruction fetching unit.

5. The digital signal processor according to claim 4, wherein the digital signal processor provides the processing data by one instruction.

6. A digital signal processor comprising:
    an arithmetic logic unit configured to perform a register—register arithmetic logic operation,
    wherein the arithmetic logic unit is used to determine a first minimum data of a first data and a second data, in a single cycle that also includes a determination of a second minimum data of a third data and a fourth data.

7. The digital signal processor according to claim 6, wherein the digital signal processor provides the first minimum data as a high part of a processing data and provides the second minimum data as a low part of the processing data.

8. The digital signal processor according to claim 7, wherein the digital signal processor provides the first data if the first data is equal to the second data, and provides the third data if the third data is equal to the fourth data.

9. The digital signal processor according to claim 8, further comprising:
    an instruction fetching unit that fetches instructions;
    a decoding unit that decodes the instructions fetched by the instruction fetching unit.

10. The digital signal processor according to claim 9, wherein the digital signal processor provides the processing data by one instruction.

* * * * *